(12) United States Patent
Hirano

(10) Patent No.: US 6,542,410 B2
(45) Date of Patent: Apr. 1, 2003

(54) NONVOLATILE SEMICONDUCTOR MEMORY DEVICE CAPABLE OF REDUCING PRE-ERASE WRITE TIME AND ERASE METHOD THEREFOR

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/056,061

(22) Filed: Jan. 28, 2002

(65) Prior Publication Data

US 2002/0154547 A1 Oct. 24, 2002

(30) Foreign Application Priority Data

Jan. 29, 2001 (JP) ........................................ 2001-019894

(51) Int. Cl.$^7$ ............................................. G11C 16/00
(52) U.S. Cl. ............................. 365/185.3; 365/185.22; 365/185.33
(58) Field of Search ...................... 365/185.3, 185.29, 365/185.22, 185.33

(56) References Cited

U.S. PATENT DOCUMENTS

| | | | |
|---|---|---|---|
| 5,784,318 A | | 7/1998 | Anami .................. 365/185.22 |
| 5,936,891 A | * | 8/1999 | Sekiguchi .............. 365/185.26 |
| 6,407,944 B1 | * | 6/2002 | Choi et al. ............. 365/185.09 |
| 6,407,947 B2 | * | 6/2002 | Ahn et al. ............. 365/185.29 |
| 6,452,837 B2 | * | 9/2002 | Mori et al. ............. 365/185.3 |

FOREIGN PATENT DOCUMENTS

JP   10-64288   3/1998

* cited by examiner

*Primary Examiner*—Tan T. Nguyen
(74) *Attorney, Agent, or Firm*—Morrison & Foerster LLP

(57) ABSTRACT

None of memory cells employed in a memory cell array 27 is not put into an overerased state even if erase pulse application for 300 ms is executed four times in a fast cell out of the memory cells. Accordingly, one block in the memory cell array 27 is divided into four regions, and the pre-erase written state of each region is written into an erase frequency storage memory 29 that has memory cells of 3-bit for storing an erase frequency. Then, by referring to the contents of the erase frequency storage memory 29, pre-erase write and write verify are executed in one region only once every four erase operations. Thus, the region of the pre-erase write executed during one erase operation is made to be one-fourth of the conventional region, shortening a pre-erase write pulse applying time and a write verify time and reducing an increase in the pre-erase write time ascribed to a reduction in operating voltage.

13 Claims, 15 Drawing Sheets

ERASE FREQUENCY
STORAGE MEMORY 29

| M3, M2, M1 | I | FLAG 28 |
|---|---|---|
| 1, 1, 1 → | 0 | 0 |
| 1, 1, 0 → | 1 | 0 |
| 1, 0, 0 → | 2 | 0 |
| 0, 0, 0 → | 3 | 1 |

Fig.8A

| | |
|---|---|
| Block1 | //Block0// |
| Block3 | Block2 |
| Block5 | //Block4// |
| Block7 | Block6 |
| Block9 | //Block8// |
| Block11 | Block10 |
| Block13 | //Block12// |
| Block15 | Block14 |
| Block17 | //Block16// |
| Block19 | Block18 |
| Block21 | //Block20// |
| Block23 | Block22 |
| Block25 | //Block24// |
| Block27 | Block26 |
| Block29 | //Block28// |
| Block31 | Block30 |

BLOCK (HATCHED AREA)
SUBJECTED TO PRE-ERASE
WRITE BY FIRST-TIME
FULL-CHIP ERASE

Fig.8B

| | |
|---|---|
| //Block1// | Block0 |
| Block3 | Block2 |
| //Block5// | Block4 |
| Block7 | Block6 |
| //Block9// | Block8 |
| Block11 | Block10 |
| //Block13// | Block12 |
| Block15 | Block14 |
| //Block17// | Block16 |
| Block19 | Block18 |
| //Block21// | Block20 |
| Block23 | Block22 |
| //Block25// | Block24 |
| Block27 | Block26 |
| //Block29// | Block28 |
| Block31 | Block30 |

BLOCK (HATCHED AREA)
SUBJECTED TO PRE-ERASE
WRITE BY SECOND-TIME
FULL-CHIP ERASE

Fig.8C

| | |
|---|---|
| Block1 | Block0 |
| Block3 | //Block2// |
| Block5 | Block4 |
| Block7 | //Block6// |
| Block9 | Block8 |
| Block11 | //Block10// |
| Block13 | Block12 |
| Block15 | //Block14// |
| Block17 | Block16 |
| Block19 | //Block18// |
| Block21 | Block20 |
| Block23 | //Block22// |
| Block25 | Block24 |
| Block27 | //Block26// |
| Block29 | Block28 |
| Block31 | //Block30// |

BLOCK (HATCHED AREA)
SUBJECTED TO PRE-ERASE
WRITE BY THIRD-TIME
FULL-CHIP ERASE

Fig.8D

| | |
|---|---|
| Block1 | Block0 |
| //Block3// | Block2 |
| Block5 | Block4 |
| //Block7// | Block6 |
| Block9 | Block8 |
| //Block11// | Block10 |
| Block13 | Block12 |
| //Block15// | Block14 |
| Block17 | Block16 |
| //Block19// | Block18 |
| Block21 | Block20 |
| //Block23// | Block22 |
| Block25 | Block24 |
| //Block27// | Block26 |
| Block29 | Block28 |
| //Block31// | Block30 |

BLOCK (HATCHED AREA)
SUBJECTED TO PRE-ERASE
WRITE BY FOURTH-TIME
FULL-CHIP ERASE

NONVOLATILE SEMICONDUCTOR MEMORY DEVICE CAPABLE OF REDUCING PRE-ERASE WRITE TIME AND ERASE METHOD THEREFOR

BACKGROUND OF THE INVENTION

The present invention relates to a nonvolatile semiconductor memory device in which write is executed by means of channel hot electrons and an erase method therefor.

Conventionally, there has been an ETOX (EPROM THIN OXIDE: trademark of Intel Corp.) as a flash memory (batch erase type memory) used most generally. FIG. 12 shows a schematic sectional view of this ETOX type flash memory cell 8. As is apparent from FIG. 12, a floating-gate 5 is formed via a tunnel oxide film 4 on a source 1, a drain 2 and a substrate (well) 3 located between the source and the drain. Further, a control gate 7 is formed on the floating-gate 5 via a layer insulation film 6.

The principle of operation of the ETOX type flash memory cell 8 will now be described. As shown in the following Table 1, during write, a voltage Vpp (10 V, for example) is applied to the control gate 7, a reference voltage Vss (0 V, for example) is applied to the source 1, and a voltage of 6 V is applied to the drain 2. With this arrangement, a large amount of current flows through the channel layer to generate channel hot electrons in a portion of a high electric field on the drain 2 side, and the electrons are injected into the floating-gate 5. Consequently, the threshold voltage of the memory cell 8 rises to execute write into the memory cell 8. FIG. 13 shows threshold voltage distributions in a written state and an erased state. As shown in FIG. 13, the threshold voltage of the written memory cell 8 becomes equal to or higher than 5 V.

TABLE 1

|  | Control Gate 7 | Drain 2 | Source 1 | Substrate 3 |
| --- | --- | --- | --- | --- |
| Write | 10 V | 6 V/ Open | 0 V | 0 V |
| Erase | −9 V | Open | 6 V | 0 V |
| Read | 5 V | 1 V | 0 V | 0 V |

During erase, by applying a voltage Vnn (−9 V, for example) to the control gate 7, applying a voltage Vpe (6 V, for example) to the source 1 and making the drain 2 open, intense electric field occurs in the tunnel oxide film 4 located between the source 1 and the floating-gate 5. Then, electrons are extracted from the floating-gate 5 toward the source 1 by the Fowler-Nordheim (FN) tunneling phenomenon, lowering the threshold voltage of the memory cell 8. Consequently, as shown in FIG. 13, the threshold voltage of the erased memory cell 8 becomes 1.5 V to 3 V.

During read, a voltage of 1 V is applied to the drain 2, and a voltage of 5 V is applied to the control gate 7. In this case, when the memory cell 8 is in the erased state and has a low threshold voltage, a current flows through the memory cell 8 to determine that the state is "1". When the memory cell 8 is in the written state and has a high threshold voltage, no current flows through the memory cell 8 to determine that the state is "0".

On the basis of the principle of operation as described above, the write, erase and read of the memory cell 8 are executed. During the erase of the actual nonvolatile semiconductor memory device, the erase is executed in batch processing of comparatively large blocks of, for example, 64 kB. In the above case, the threshold voltages of the memory cells inside the block to be erased include those in the written state (threshold voltage is not lower than 5 V in FIG. 13) and those in the erased state (threshold voltage is 1.5 V to 3 V in FIG. 13), which exist in a mixed state. Then, in order to put the threshold voltages of all the memory cells 8 that are to be erased within a specified threshold voltage distribution (1.5 V to 3 V, for example), a complicated algorithm is used for the batch erase.

During erase, it is a key point to prevent the occurrence of a memory cell in an overerased (excessively erased) state in which the threshold voltage becomes equal to or lower than 0 V due to the application of an erase pulse to a memory cell that originally has a low threshold voltage and the application of an erase pulse to a memory cell in which the threshold voltage is lowered fast due to variations in erase characteristics.

Upon the occurrence of the memory cell in the overerased state, if it is attempted to apply a specified voltage (3.0 V, for example, in the case of erase verify) to the word line connected to the control gate 7 of the selected memory cell while setting a voltage of 0 V on the word line connected to the control gate 7 of the non-selected memory cell during, for example, write verify or erase verify and to execute verify based on the presence or absence of a cell current flowing through the non-selected memory cell, then a cell current flows also through the memory cell in the overerased state that exists among the non-selected memory cells. Therefore, it is unable to correctly verify the presence or absence of a cell current in the selected memory cells. That is, since the threshold voltage cannot be verified, the write and erase cannot correctly be executed. Therefore, if the memory cell in the overerased state occurs, then the reliability of the nonvolatile semiconductor memory device is impaired.

FIG. 14 shows one example of the erase algorithm for preventing the occurrence of the memory cell in the overerased state. When the erase operation is started in FIG. 14, pre-erase write for preventing the overerase is first executed in all the memory cells in step S1. This pre-erase write operation is the same as the ordinary write operation described hereinabove and executed as follows. That is, the voltages shown in Table 1 are applied to the sources 1 and the substrates (wells) 3 of all the memory cells 8 in the block to be subjected to erase. Then, the memory cells 8 are sequentially selected for the application of the voltages shown in Table 1 to the control gates 7 and the drains 2.

In step S2, the write verify is executed. That is, the threshold voltage value of each memory cell 8 is verified. It is determined in step S3 whether or not the verify result is acceptable, i.e., it is determined whether or not the threshold voltage values of all the memory cells 8 are not lower than the specified value (5.0 V) that represents the written state. As a result, the program flow returns to the step S1 to repeat the pre-erase write when it is unacceptable or proceeds to step S4 when it is acceptable. In this case, the write verify operation has the same application voltages to the drain 2, the source 1 and the substrate (well) 3 as in the read operation in Table 1 and also has an application voltage of 5.0 V to the control gate 7. Thus, the voltage of 5.0 V is applied via the word line to the control gate 7 of the selected memory cell 8 in which the write verify is executed, while a voltage of 0 V is applied to the control gate 7 of the non-selected memory cell 8 to determine whether or not a cell current flows through the selected memory cell 8. Then, it is determined that the threshold voltage of the selected memory cell 8 is not lower than 5.0 V and the written state is established when no cell current flows through the selected memory cell 8. In contrast to this, when a cell current flows, it is determined that the threshold voltage of the selected memory cell 8 is lower than 5.0 V, and the pre-erase write is executed again. Subsequently, this operation is repeated, and the pre-erase write is ended when the threshold voltages of all the memory cells to be erased become equal to or higher than 5.0 V.

In step S4, the erase pulse is applied. The pulse width of the erase pulse in the above case is set to, for example, 10 ms, which is shorter than the erase time required for changing the written state into the erased state so that a number of memory cells, in which the threshold voltage is lowered fast attributed to the variations in the erase characteristics, is not put into the overerased state. Then, by putting the drain 2 of the memory cell 8 to be subjected to erase into an open state, making the substrate (well) 3 have a voltage of 0 V, applying an erase pulse of −9 V to the control gate 7 and applying an erase pulse of 6 V to the source 1, the erase is executed in blocks.

The erase verify is executed in step S5 so as to verify whether or not the threshold voltage of the erased memory cell has a specified value. The erase verify operation has the same application voltages to the drain 2, the source 1 and the substrate (well) 3 as in the read operation in Table 1 and has only a varied application voltage of 3.0 V to the control gate 7. Thus, by applying a voltage of 3.0 V via the word line to the control gate 7 of the selected memory cell 8 in which the erase verify operation is executed and applying a voltage of 0 V to the control gate 7 of the non-selected memory cell, it is determined whether or not a cell current flows through the selected memory cell. Then, if a cell current flows through the selected memory cell, then it is determined that the threshold voltage of the selected memory cell is not lower than 3.0 V and the erased state is established. In contrast to this, it is determined that the threshold voltage of the selected memory cell is higher than 3.0 V when no cell current flows.

It is determined in step S6 whether or not the verify result is acceptable, i.e., it is determined whether or not the threshold voltages of all the memory cells are not higher than the specified value (3.0 V) that represents the erased state. As a result, the program flow returns to the step S4 to repeat the application of the erase pulse when it is unacceptable or proceeds to step S7 when it is acceptable. Thus, all the memory cells in the block to be subjected to erase are made to have a threshold voltage of not higher than 3.0 V while alternately executing the application of the erase pulse of the aforementioned pulse width and the verify of the threshold voltage by the erase verify.

In this case, one example of a change in the threshold voltage with respect to an erase pulse applying time is shown in FIG. 15 as an example of the erase characteristics of the memory cell 8. In FIG. 15, when the erase pulse is applied for only 300 ms, a threshold voltage Vt of the memory cell 8 in which the threshold voltage Vt is lowered most rapidly (fast cell) is 1.5 V, and the threshold voltage Vt of the memory cell 8 in which the threshold voltage Vt is lowered most slowly (slow cell) is 3.0 V, depending on the variations in the erase characteristics.

In the case of the memory cells that have the aforementioned erase characteristics, it is determined that the threshold voltage Vt is not higher than 3.0 V (threshold voltage Vt of the slow cell is 3.0 V) through the erase verify with regard to all the memory cells to be erased. On the other hand, the threshold voltage Vt of the fast cell becomes 1.5 V when the erase pulse application ends, and therefore, the distribution of the threshold voltages Vt of all the memory cells in the erased state falls within a range of 1.5 V to 3.0 V.

In step S7, overerase verify for verifying whether or not a memory cell in the overerased state exists is executed. This overerase verify operation has the same application voltages to the source 1 and the substrate (well) 3 as in the read operation in Table 1, and an application voltage of 0 V to the control gate 7 is different from that in the read operation in Table 1. Thus, by applying a voltage of 0 V to all the control gates 7 and applying a voltage of 1 V via the bit line to the drain 2 of the selected memory cell in which the overerase verify is executed, it is determined whether or not a cell current flows through the bit line terminal. Then, if no cell current flows, then it is determined that there is no memory cell in the overerased state among the plurality of memory cells whose drains are connected to the bit line. Then, a voltage of 1 V is applied to the next bit line to execute the overerase verify of the memory cell relevant to the bit line. In this case, if a cell current flows, then it is determined that there is a memory cell in the overerased state among the plurality of memory cells whose drains are connected to the bit line.

It is determined in step S8 whether or not the verify result is acceptable. The program flow proceeds to step S9 when at least one memory cell in the overerased state is consequently detected, or otherwise the erase processing operation is ended when no such memory cell exists. In step S9, soft write (slight write) is executed in the memory cell in the overerased state. This soft write operation is to apply voltages to the source 1 and the substrate (well) 3 of the memory cell similarly to the write operation in Table 1. Then, this operation is executed by sequentially applying the same voltage as that of the write operation in Table 1 to the drain 2 and a voltage of 6 V to the control gate. Then, the overerase verify is executed again, and it is determined that all the memory cells in the overerase state have disappeared if no cell current flow is detected on the bit line. If a cell current flow is detected, then the soft write is executed again. Thus, the soft write and the overerase verify are alternately continued until no cell current is detected. Then, if no cell current becomes detected in the step S8, then the erase processing operation is ended.

Fundamentally, the nonvolatile semiconductor memory device in the initial state normally has a threshold voltage distribution in the erased state in FIG. 13. Therefore, even if the threshold voltage is verified by the next overerase verify, the memory cell in the overerased state is not practically found, and the soft write for putting the overerased state back into the erased state is not executed. However, if a memory cell that has a threshold voltage Vt of not higher than 0 V is found as a consequence of the execution of the overerase verify, then the aforementioned soft write is to be executed.

The above has described the fundamental example of the erase algorithm for preventing the occurrence of the memory cell in the overerased state shown in FIG. 14.

Next, it is tried to estimate the total erase time required for the erase operation shown in FIG. 14 and obtain a occupancy ratio of the pre-erase write time with respect to the total erase time. In this case, the pre-erase write operation is executed according to the normal write operation shown in Table 1 as described above. When the power voltage Vcc of the nonvolatile semiconductor memory device is 5 V, a write pulse (for example, a pulse of 10 V applied to the control gate 7) is generated by a boosting use charge pump circuit provided inside on the basis of this voltage of 5 V. In the above case, the output capability of the boosting use charge pump circuit or the like enables simultaneous write of eight memory cells corresponding to one byte.

Assuming that the time of write into one memory cell is 2 μs, then a time required for the pre-erase write of 64 kB in one block is expressed by the equation (1):

$$2\ \mu s \times 64\ k \times 8 \div 8 = 2\ \mu s \times 64 \times 1024 = 131\ ms. \qquad (1)$$

Further, a time required for the erase verify to be executed after the pre-erase write is about 90 ms.

Next, the erase pulse (pulse width: 10 ms) is applied while executing the erase verify. In the above case, the total pulse applying time is about 300 ms, and the total erase verify time is about 180 ms. Finally, a time required for the overerase verify is about 90 ms.

With regard to the soft write, the variations in the erase characteristics of the normal nonvolatile semiconductor memory device are shown in FIG. 15 as described above, and therefore, the soft write is not often executed. Therefore, a time required for the soft write is not estimated here. It is to be noted that the time required for the soft write is determined depending on the number of memory cells in the overerased state.

Therefore, the total erase time is about 791 ms, which is the sum of the pre-erase write time (131 ms), the write verify time (about 90 ms), the total pulse applying time (about 300 ms), the total erase verify time (about 180 ms) and the overerase verify time (about 90 ms). Moreover, the pre-erase write time is 131 ms, and therefore, the occupancy ratio of the pre-erase write time with respect to the total erase time becomes about 16%.

In this case, the pre-erase write, which is the same operation as the normal write, has a fast write speed. However, the written state is established with the threshold voltage raised by injecting channel hot electrons from the drain 2 side into the floating-gate 5, and therefore, the consumption of current is large. Therefore, if the power voltage Vcc of the nonvolatile semiconductor memory device is lowered to a voltage of, for example, 3.0 V or 2.4 V or further to 1.8 V, then this pre-erase write time is increased.

FIG. 16 shows this situation. It can be understood from FIG. 16 that, when the power voltage Vcc of the nonvolatile semiconductor memory device is lowered, the number of memory cells (number of bits) in which the pre-erase write can be concurrently executed is reduced, and the time required for the pre-erase write in the memory cells of 64 kB is increased.

The above means that the current consumed during the pre-erase write has a large value of 50 μA per memory cell (one bit) in the case of the pre-erase write that uses channel hot electrons. Therefore, when the power voltage Vcc is lowered, the current supply capability of the boosting charge pump circuit that generates each write pulse through boosting from this power voltage Vcc is reduced, and the number of memory cells in which the write can be executed at a time is reduced.

As shown in FIG. 16, it is possible to execute the pre-erase write concurrently in eight memory cells when the power voltage Vcc=5 V. However, when the power voltage Vcc=1.8 V, the concurrent write can be executed in only one memory cell. As a result, in contrast to the fact that the pre-erase write time in the memory cells of 64 kB in one block is 131 ms when Vcc=5 V as described above, the time is increased to 1048 ms when Vcc=1.8 V. Therefore, the total erase time when Vcc=1.8 V becomes 1708 ms, and this means that the occupancy ratio of the pre-erase write time with respect to the total erase time amounts up to about 61%.

In view of the above, it has become an important factor to reduce the pre-erase write time in order to reduce the total erase time for the reduction in voltage and the integration of the nonvolatile semiconductor memory device expected in the future.

There has been proposed a flash erase type nonvolatile memory of which the pre-erase write time is shortened with an erase method therefor (Japanese Patent Laid-Open Publication No. HEI 10-64288). FIG. 17 shows a circuit block diagram, and FIG. 18 shows a flowchart of the pre-erase write processing operation. In the flash erase type nonvolatile memory shown in FIG. 17, when an erase mode is designated by an input/output signal IO, a pre-erase write and verify period signal WVP from an internal sequence control section 11 rises. The initial value of the address of the memory cell array 14 is set to the least significant address by an internal address generating circuit 12 (step S11), and decoding is executed by a decoding section 13. Then, a pre-erase write control signal PW from the internal sequence control section 11 comes to have an active level, and the pre-erase write at the least significant address of the memory cell array 14 is executed by a write circuit 15. The pre-erase write will be executed while sequentially incrementing an address IAD (steps S12 through S14). When the pre-erase write at the most significant address is ended, a last address detection signal EAD is outputted from the internal address generating circuit 12. Then, a first-time pre-erase write end signal FWE from a first-time write recognizing circuit 16 comes to have an active level, and a verify control signal VF from the internal sequence control section 11 comes to have an active level. Thus, the verify is executed sequentially from the least significant address by a verify circuit 17 (steps S15, S16, S19 and S20). Then, if the result is defective, the pre-erase write control signal PW comes to have an active level, and the rewrite is executed by the write circuit 15 (steps S17 and S18).

Thus, when the pre-erase write is ended, the erase pulse application is started by the internal address generating circuit 12 and an erase circuit 18.

However, the aforementioned prior art flash erase type nonvolatile memory in which the pre-erase write time is shortened and the erase method thereof have the following problems. That is, the flash erase type nonvolatile memory is provided with the first-time write recognizing circuit 16, by which the first-time pre-erase write is executed first in all the memory cells and the rewrite is executed in only the memory cells of the defective write found through the process of executing the verify. By this operation, the pre-erase write time can be further shortened in comparison with the erase algorithm shown in FIG. 14 to repetitively execute the pre-erase write and the verify in one-byte units.

However, there is no change of the fact that the current consumed during the pre-erase write has a very large value of 500 μA. Therefore, if the power voltage Vcc is lowered, then the current supply capability of the boosting charge pump circuit that generates each write pulse through boosting from this power voltage Vcc is reduced. Therefore, the problems that the number of memory cells in which the write can be executed at a time is reduced and the pre-erase write time of the memory cells of 64 kB in one block becomes long are not solved at all.

SUMMARY OF THE INVENTION

Accordingly, the object of the present invention is to provide a nonvolatile semiconductor memory device capable of reducing the pre-erase write time that increases as the operating voltage is lowered and consequently reducing the erase time and an erase method therefor.

In order to achieve the aforementioned object, this invention provides a nonvolatile semiconductor memory device in which floating-gate field-effect transistors that respectively have a control gate, a floating-gate, a drain and a source and are able to electrically write and erase information are arranged in a matrix form on a substrate or a well with a plurality of row lines connected to the control gates of the floating-gate field-effect transistors arranged in a direction of row and with a plurality of column lines connected to the drains of the floating-gate field-effect transistors arranged in a direction of column and in which the floating-gate field-effect transistors that constitute a block have their sources connected to a common source line, wherein the floating-gate field-effect transistors, which belong to an erase object division to be subjected to batch erase, are divided into n (positive integer) regions, and comprising: for each erase object division, an erase frequency storage means for storing an erase frequency of the erase object division;

an address setting means for setting addresses of regions which belongs to the erase object division and in which pre-erase write is executed on the basis of storage contents of the erase frequency storage means;

a flag means for storing flag information that represents the erase frequency reaching n every time the erase frequency of the erase object division reaches n; and an erase frequency resetting means for resetting the storage contents of the erase frequency storage means when the flag information is stored in the flag means.

According to the above-mentioned construction, when the erase is executed in an arbitrary erase object division to be subjected to erase, the erase frequency is stored in the erase frequency storage means corresponding to the erase object division to be subjected to erase. Then, the address of the region in which the pre-erase write is executed is set on the basis of the storage contents of the erase frequency storage means by the address setting means, and the pre-erase write is executed in the set region during erase corresponding to the erase object division. This operation is subsequently repeated. When the erase frequency of the erase object division becomes n, the flag information is stored in the flag means, and the storage contents of the erase frequency storage means is reset by the erase frequency resetting means.

Therefore, the pre-erase write is executed in only the floating-gate field-effect transistors of 1/n of the erase object division every one erase operation corresponding to the erase object division to be subjected to erase. As a result, the pre-erase write time during one erase operation becomes 1/n of that of the prior art, and the total erase operation time is consequently shortened. Thus, the increase in the erase time is prevented, even if the operating voltage is reduced.

In one embodiment, the erase object division is the block.

According to this embodiment, the prevention of the increase in the erase time ascribed to the reduction in the operating voltage is applied to a block erase system nonvolatile semiconductor memory device.

In one embodiment, the erase object division is a memory cell array comprised of the floating-gate field-effect transistors arranged in a matrix form, and the division into n regions of the erase object division is executed in the blocks.

According to this embodiment, the prevention of the increase in the erase time ascribed to the reduction in the operating voltage is applied to a full-chip erase system nonvolatile semiconductor memory device.

In one embodiment, the erase frequency storage means is comprised of (n−1) nonvolatile semiconductor memories.

In one embodiment, the nonvolatile semiconductor memories that constitute the erase frequency storage means have a structure identical to that of the floating-gate field-effect transistors arranged in a matrix form.

According to these embodiments, reset by the erase circuit resetting means can be executed concurrently with the erase of the floating-gate field-effect transistor by applying the erase pulse to the nonvolatile semiconductor memory that constitutes the erase frequency storage means concurrently with the application of the erase pulse to the floating-gate field-effect transistor arranged in a matrix form. That is, it is enabled to concurrently use the erase circuit of the floating-gate field-effect transistor arranged in a matrix form as the erase circuit resetting means.

One embodiment comprises an erase control means for operating, when an erase operation of an arbitrary erase object division is started, to read the (n−1) nonvolatile semiconductor memories that constitute the erase frequency storage means corresponding to the erase object division and operating, when any unwritten nonvolatile semiconductor memory or memories exist, to execute write in one of the nonvolatile semiconductor memories and operating, when all the nonvolatile semiconductor memories are in a written state, to store the flag information into the flag means.

According to this embodiment, the erase control means makes the erase frequency storage means store the erase frequency of the erase object division. Furthermore, every time the erase frequency of the erase object division becomes n, the flag means exactly stores the flag information.

This invention also provides an erase method for a nonvolatile semiconductor memory device in which floating-gate field-effect transistors that respectively have a control gate, a floating-gate, a drain and a source and are able to electrically write and erase information are arranged in a matrix form on a substrate or a well with a plurality of row lines connected to the control gates of the floating-gate field-effect transistors arranged in a direction of row and with a plurality of column lines connected to the drains of the floating-gate field-effect transistors arranged in a direction of column and in which the floating-gate field-effect transistors that constitute a block have their sources connected to a common source line, the erase method comprising the step of:

executing pre-erase write in only floating-gate field-effect transistors of 1/n (n≧2) of the floating-gate field-effect transistors that belong to an erase object division to be subjected to batch erase.

According to the above-mentioned invention, the pre-erase write is executed in only the floating-gate field-effect transistors of 1/n of the erase object division every one erase operation corresponding to an arbitrary erase object division. Therefore, the pre-erase write time during one erase operation becomes 1/n of that of the prior art, and the total erase operation time is consequently shortened. Thus, the increase in the erase time ascribed to the reduction in the operating voltage is prevented.

In one embodiment, the erase object division is the block.

According to this embodiment, the prevention of the increase in the erase time ascribed to the reduction in the operating voltage is applied to a block erase method.

In one embodiment, the erase object division is a memory cell array comprised of the floating-gate field-effect transistors arranged in a matrix form, and the floating-gate field-effect transistors in which the pre-erase write is executed are set in the blocks.

According to this embodiment, the prevention of the increase in the erase time ascribed to the reduction in the operating voltage is applied to a full-chip erase method.

In one embodiment, the 1/n floating-gate field-effect transistors are set by dividing the erase object division into n regions, and the pre-erase write is executed in only one region out of the n regions that constitute the erase object division during one erase operation for the erase object division.

According to this embodiment, the pre-erase write to 1/n of the floating-gate field-effect transistors that belong to the erase object division is executed in units of regions obtained by dividing the erase object division into n regions.

In one embodiment, the n regions that constitute the erase object division are assumed to be a region 0 through a region (n−1), the pre-erase write is executed in only the region 0 during a (n·k (k: 0 or positive integer)+1)th erase operation, the pre-erase write is executed in only the region 1 during a (n·k+2)th erase operation, and the pre-erase write is executed sequentially to a region (n−1) until a (n·k+n)th erase operation.

According to this embodiment, every time the erase operation is executed in an arbitrary erase object division, the pre-erase write is executed serially in the n regions obtained by dividing the erase object division.

In one embodiment, the pre-erase write is executed in only one region selected from regions of a least pre-erase write frequency out of the n regions that constitute the erase object division.

According to this embodiment, every time the erase operation is executed in an arbitrary erase object division to be subjected to erase, the pre-erase write is executed sequentially in the n regions obtained by dividing the erase object division.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 8A, 8B, 8C and 8D are explanatory views of a pre-erase write sequence during full-chip erase of the memory cell array shown in FIG. 7;

DETAILED DESCRIPTION OF THE PREFERRED EMBODIMENTS

Figure 1:
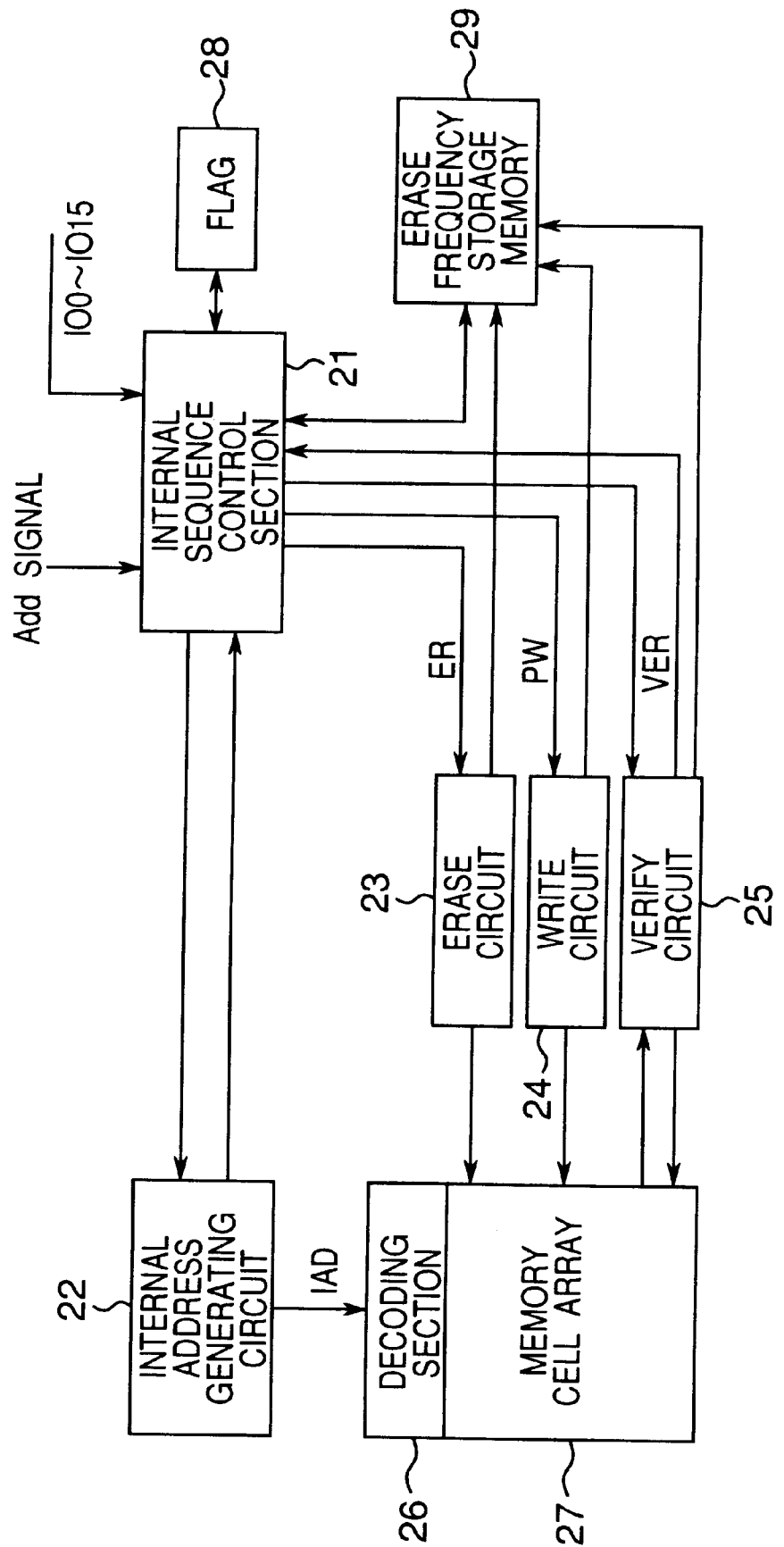
FIG. 1 is a block diagram of an erase control circuit in a nonvolatile semiconductor memory device of the present invention.

The present invention will be described in detail below on the basis of the embodiments thereof shown in the drawings.

(First Embodiment)

FIG. 1 is a block diagram of an erase control circuit for controlling an erase operation in the nonvolatile semiconductor memory device of the present embodiment. As is apparent from FIG. 1, the present erase control circuit is constructed of an internal sequence control section 21, an internal address generating circuit 22, an erase circuit 23, a write circuit 24, a verify circuit 25, a decoding section 26, a memory cell array 27, a flag 28 and an erase frequency storage memory 29.

Figure 12:
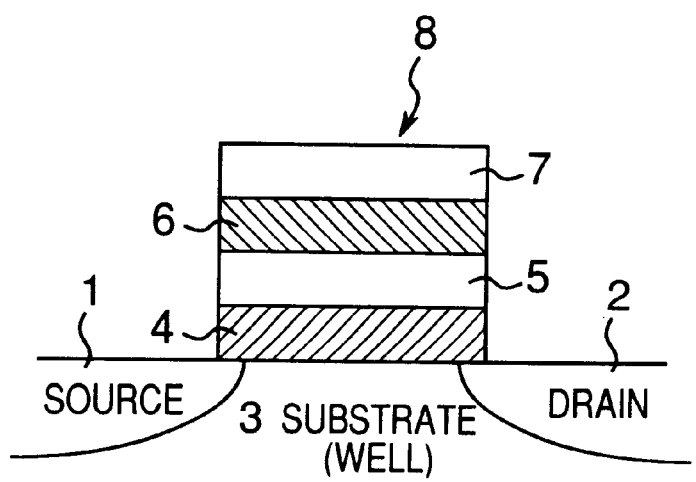
FIG. 12 is a sectional view of an ETOX type flash memory cell.
Figure 13:
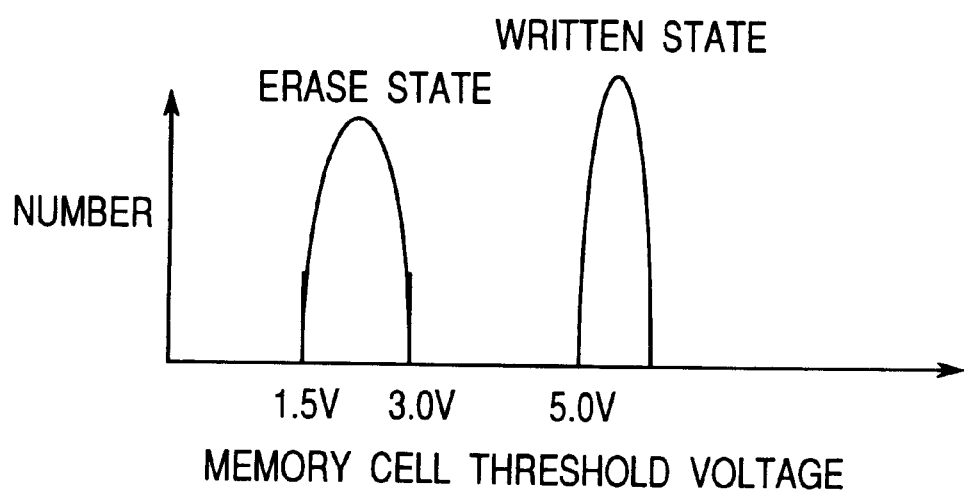
FIG. 13 is a graph showing threshold voltage distributions in the written state and the erased state of the ETOX type flash memory cell.

The memory cell array 27 is constructed of a flash memory, and the construction of each flash memory cell is the same as the construction shown in FIG. 12. The fundamental operations of write, erase and read of the memory cell array 27 are the same as the operations of write, erase and read of the conventional flash memory cell array. The erase control circuit of the present embodiment significantly differs from the conventional erase control circuit in the pre-erase write operation of the erase operation.

Figure 17:
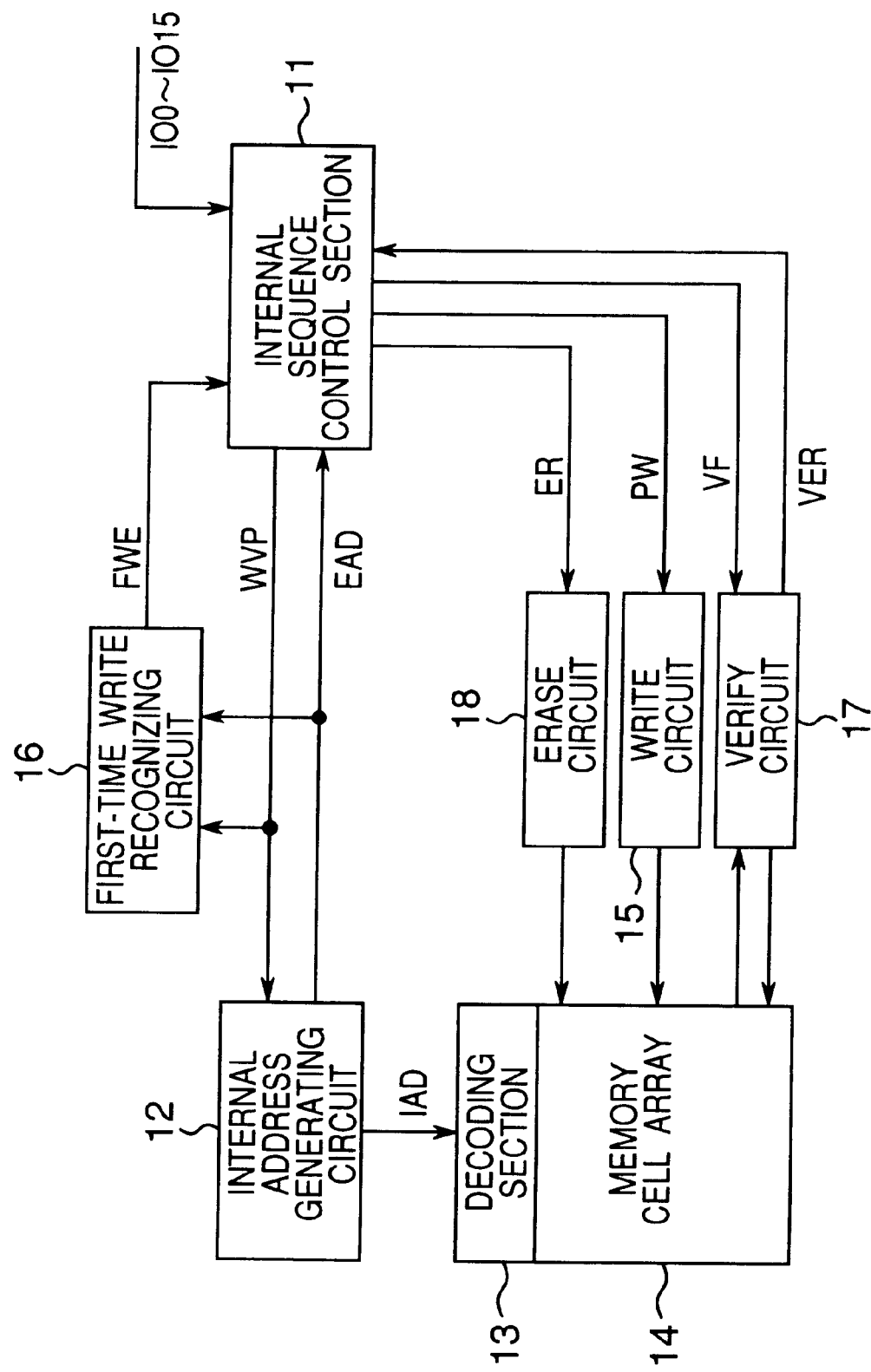
FIG. 17 is a block diagram of an erase control circuit in a conventional flash erase type nonvolatile memory of which the pre-erase write time is shortened.
Figure 18:
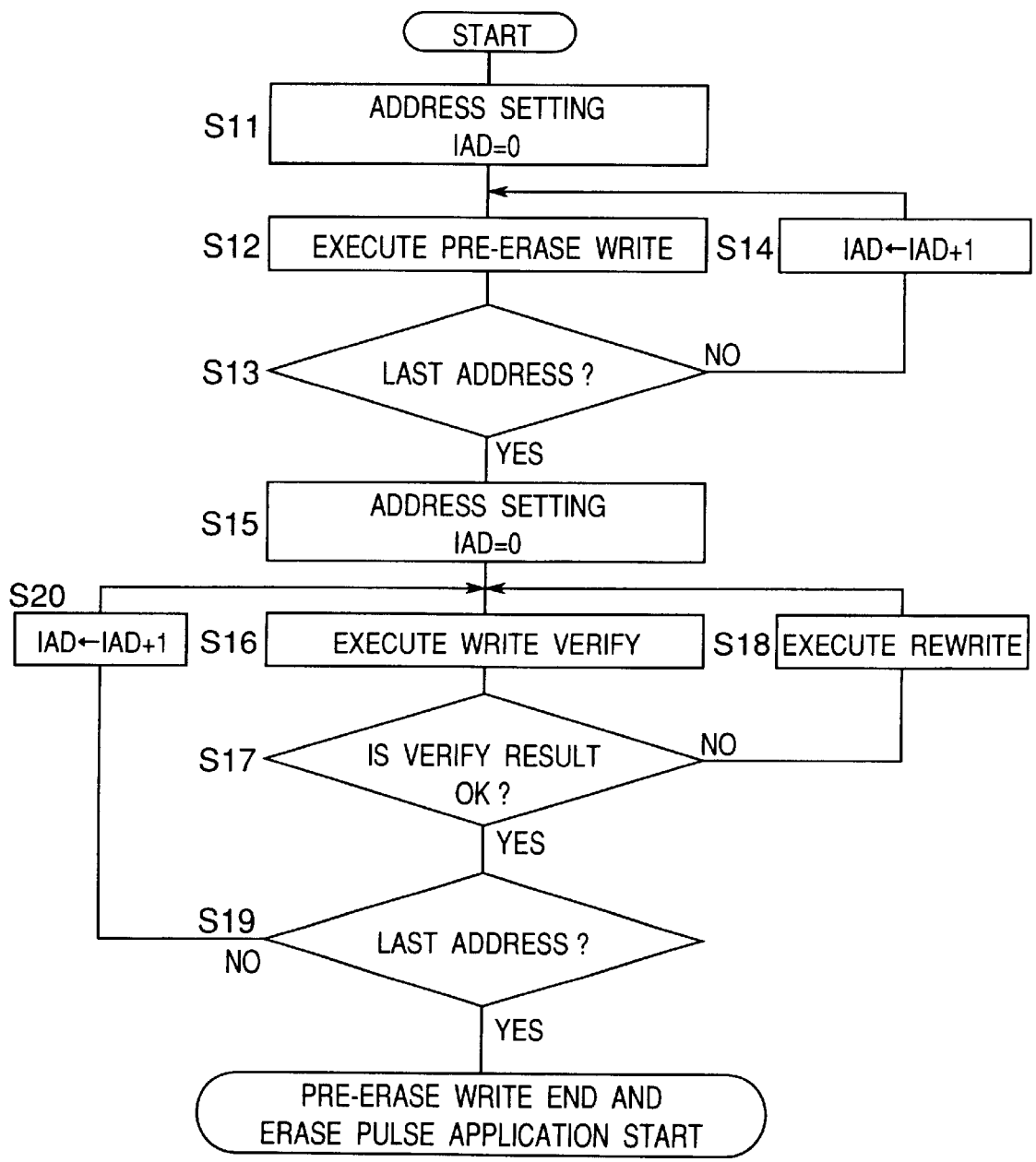
FIG. 18 is a flowchart of a pre-erase write processing operation by the erase control circuit shown in FIG. 17.

The erase control circuit shown in FIG. 1 has roughly the same construction as the conventional erase control circuit shown in FIG. 17 except for the flag 28 and the erase frequency storage memory 29. The erase frequency storage memory 29 is constructed of the same flash memory (ETOX type flash memory in this case) as that of the main memory cell array 27 and stores an erase frequency. It is to be noted that this memory cell for erase frequency storage use is allocated to each block of the memory cell array 27. Therefore, it is possible to execute write and erase in this erase frequency storage memory 29 similarly to the memory cell array 27. The present embodiment will be described on the basis of an example in which the erase frequency storage memory 29 has 3-bit memory cells. The flag 28 is a latch circuit, which is constructed of, for example, two inverters and latches "1" when all the memory cells for erase frequency storage use in the erase frequency storage memory 29 are in the written state.

Figure 2:
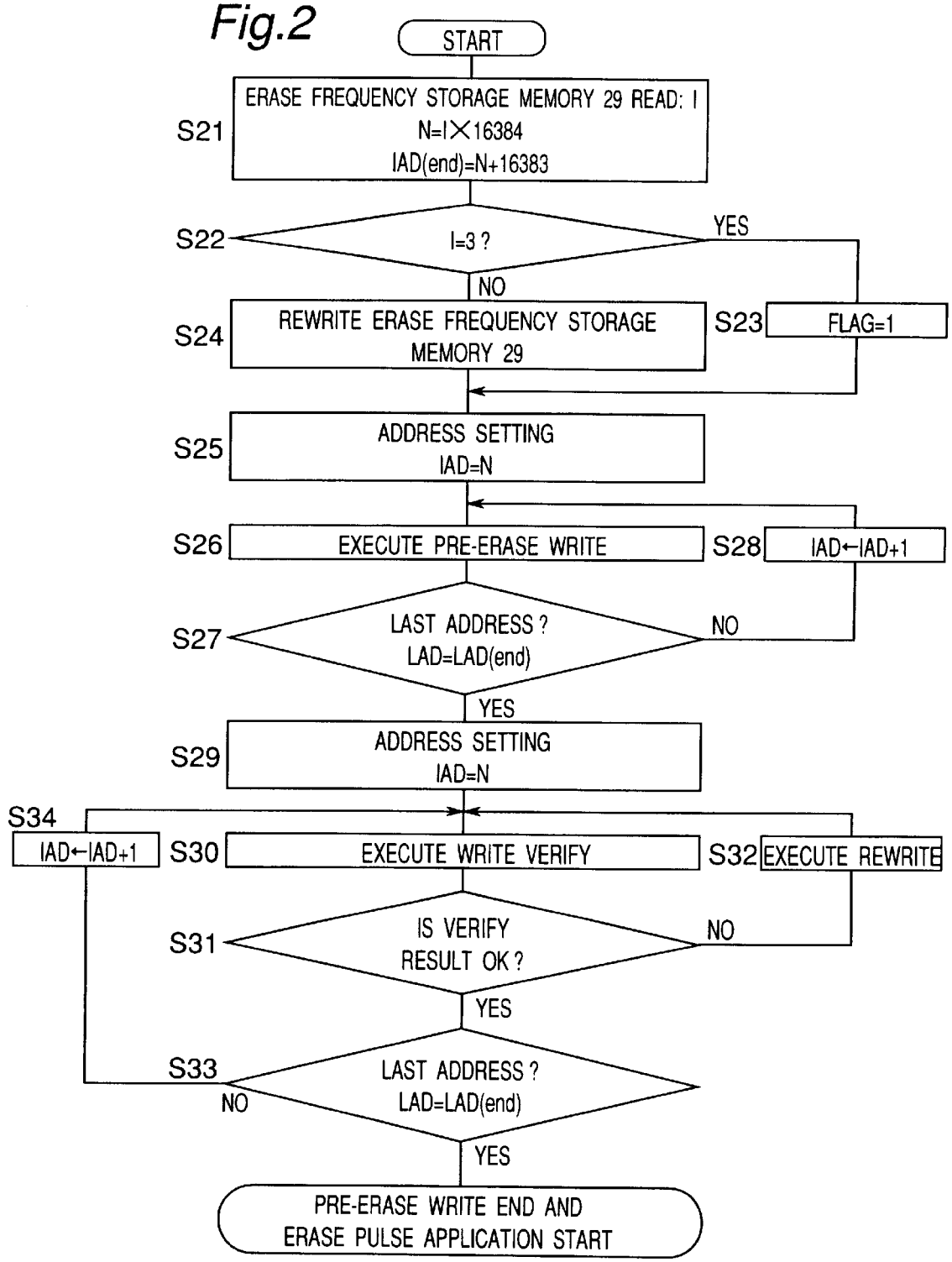
FIG. 2 is a flowchart of the algorithm of pre-erase write executed by the erase control circuit shown in FIG. 1.
Figures 3, 4:
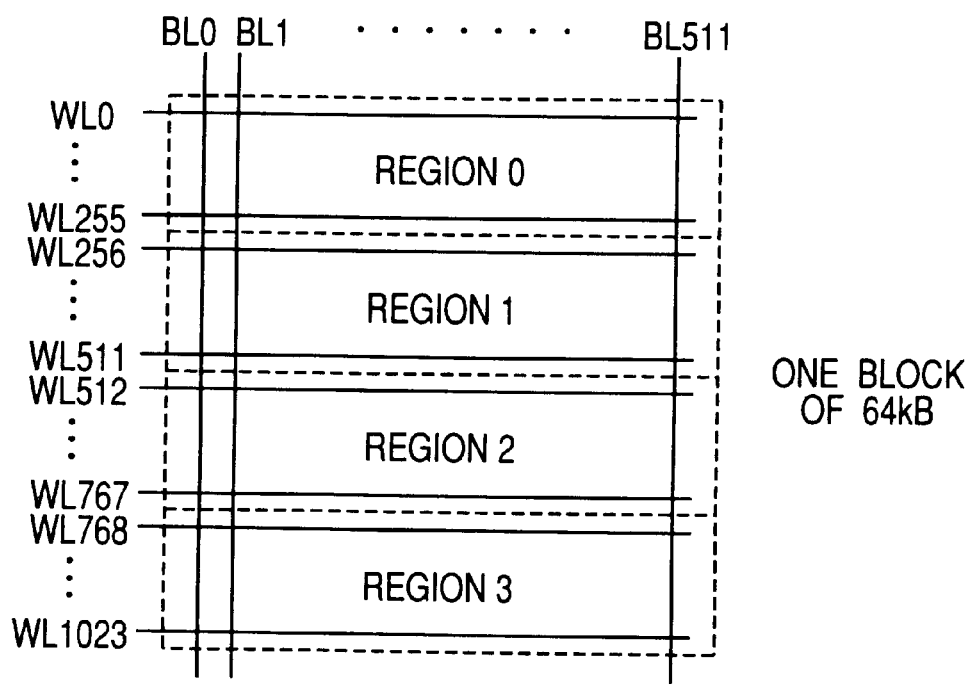
FIG. 3 is a view showing relations among the state of an erase frequency storage memory and a value I and the content of a flag in FIG. 1.
FIG. 4 is a view showing an example of division of one block into four regions.

FIG. 2 is a flowchart of a pre-erase write algorithm executed by the erase control circuit shown in FIG. 1. The following will describe the case of a pre-erase write processing operation executed in one block of the memory cell array 27 with reference to FIGS. 1 and 2. When the pre-erase write is started with the start of the erase operation, the state (state of the 3-bit memory cells M1, M2 and M3) of the erase frequency storage memory 29 is first read in step S21 by the internal sequence control section 21, and the result is assumed to be I. FIG. 3 shows a relation between the state of the 3-bit memory cell and the value of I. It is to be noted that the state "1" represents the erased state, and the state "0" represents the written state. As is apparent from FIG. 3, the erase frequency storage memory 29 has a state in which (M3, M2, M1)=(1, 1, 1) in the case of, for example, a first-time erase, and the 3-bit memory cells M1, M2 and M3 are all in the erased state. Therefore, the content of the flag 28 is "0", and the value of I in the above case is zero.

In the case of a second-time erase, the erase frequency storage memory 29 has a state in which (M3, M2, M1)=(1, 1, 0), when the two memory cells M2 and M3 are in the erased state and one memory cell M1 is in the written state. Therefore, the content of the flag 28 is "0", and the value of I in this case is one. Further, in the case of a third-time erase, the erase frequency storage memory 29 has a state of (1, 0, 0), when the memory cell M3 is in the erased state and the memory cells M1 and M2 are in the written state. Therefore, the content of the flag 28 is "0" and the value of I in this case is two. Further, in the case of a fourth-time erase, the erase frequency storage memory 29 has a state of (0, 0, 0), when the memory cells M1, M2 and M3 are all in the written state. Therefore, the content of the flag 28 is "1", and the value of I in this case is three. At this time, since the content of the flag 28 becomes "1", the memory cell array 27 is erased and the memory cells M1, M2 and M3 of the erase frequency storage memory 29 are also concurrently erased. Consequently, the program flow returns to the first-time erase in the case of a fifth-time erase, when the state of the erase frequency storage memory 29 becomes (1, 1, 1), the content of the flag 28 becomes "0", and the value of I becomes zero. Subsequently, in the case of a sixth-time erase, the state of the erase frequency storage memory 29 becomes (1, 1, 0), the content of the flag 28 becomes "0", and the value of I becomes one. That is, the state at the first time repetitively occurs for the erase every occurrence of the multiples of four.

Figure 5:
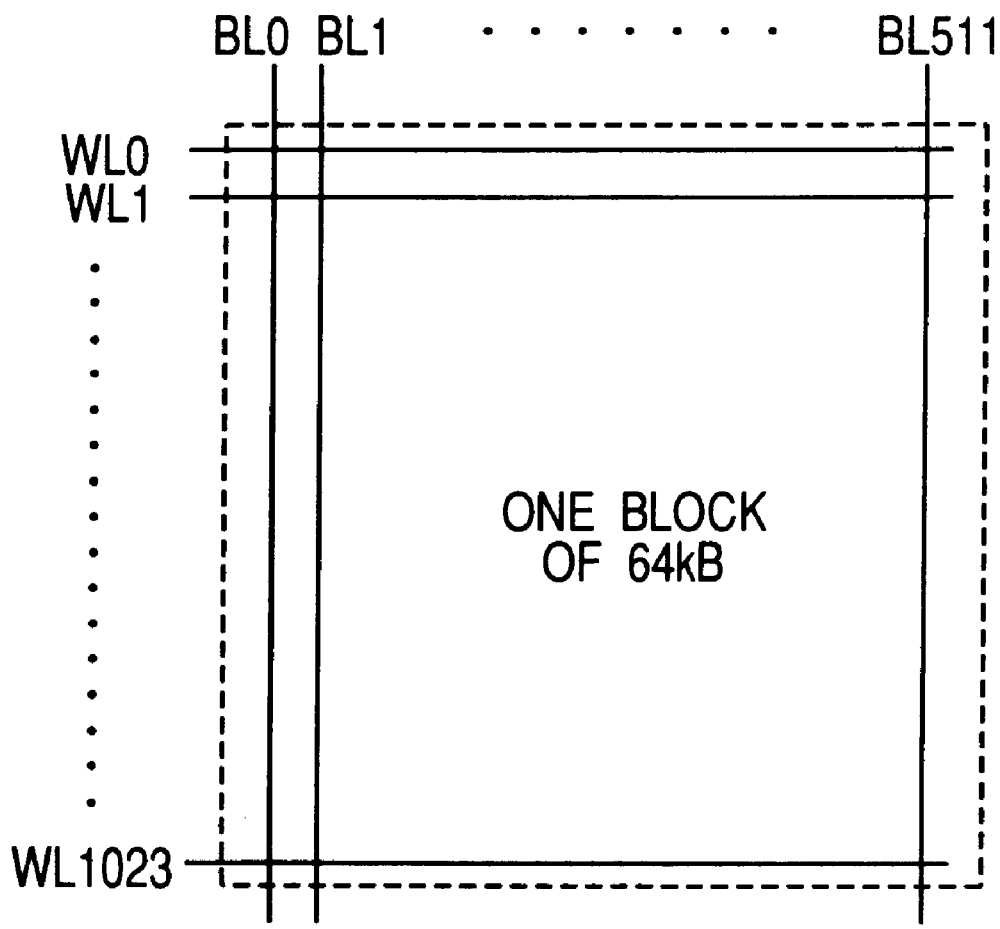
FIG. 5 is a view showing a conventional memory cell array in which one block is subjected to batch erase.

The value of I (I=0 to 3) that represents the erase frequency of the memory cell array 27 also designates one of the four regions of a region 0 to a region 3 divided from one block of 64 kB as shown in FIG. 4. In the prior art nonvolatile semiconductor memory device, as shown in FIG. 5, one block of 64 kB has been subjected to the pre-erase write collectively.

As shown in FIG. 4, one block of 64 kB is constituted of a memory cell array constructed of (1024×512) memory cells whose control gates are connected to a total of 1024 word lines WL0 through WL1023 and whose drains are connected to a total of 512 bit lines BL0 through BL511. This memory cell array is divided by word lines into the four groups of a region 0 (word lines WL0 through WL255), a region 1 (word lines WL256 through WL511), a region 2 (word lines WL512 through WL767) and a region 3 (word lines WL768 through WL1023). Then, the region 0 is designated when I=0, the region 1 is designated when I=1, the region 2 is designated when I=2, and the region 3 is designated when I=3.

Further, assuming that addresses IAD (in bytes) for designating the memory cell of one block of 64 kB are 0 through 65535 (64×1024 bytes) and the four divided regions are expressed by this addresses IAD, then IAD=0 to 16383 when I=0, IAD=16384 to 32767 when I=1, IAD=32768 to 49151 when I=2, and IAD=49152 to 65535 when I=3.

If the value of I is determined in this step according to the read result of the state (state of the 3-bit memory cells M1, M2 and M3) of the erase frequency storage memory 29, then the value of N, which is the start address of the region in which the pre-erase write is executed, is calculated according to the following equation:

$$N = I \times 16384$$

and the last address IAD(end) of the region in which the pre-erase write is executed is calculated according to the following equation:

$$IAD(end) = N + 16383$$

It is determined in step S22 whether or not I=3 by the internal sequence control section 21. Then, the program flow proceeds to step S23 when I=3 or proceeds to step S24 otherwise. In step S23, the flag 28 is set to "1" by the internal sequence control section 21. Thereafter, the program flow proceeds to step S25. It is to be noted that the content of the flag 28 remains being "0" when I=0, 1 or 2. Thus, the content of the flag 28 is set to "1" when I=3, by which the erase of the erase frequency storage memory 29 is executed concurrently when the erase pulse is applied to the memory cell array 27 after the end of the pre-erase write operation.

In step S24, the state of the memory cells (M3, M2, M1) of the erase frequency storage memory 29 is rewritten into the next state of I by the internal sequence control section 21. That is, when I=0 currently, write is executed in the memory cell M1 to rewrite the state of the erase frequency storage memory 29 into (1, 1, 0). Likewise, when I−1 currently, write is executed in the memory cell M2 to rewrite the state of the erase frequency storage memory 29 into (1, 0, 0). When I=2 currently, write is executed in the memory cell M3 to rewrite the state of the erase frequency storage memory 29 into (0, 0, 0).

In step S25, the address IAD for executing the pre-erase write is set to an initial value "N" by the internal address generating circuit 22. For example, when I=0, the pre-erase write is started from the address IAD=0. In step S26, the pre-erase write is executed by the write circuit 24 in the memory cells of one byte in the region corresponding to the value of "I" according to the address IAD. It is determined in step S27 whether or not the address IAD is the last address IAD(end) by the internal sequence control section 21. As a result, the program flow proceeds to step S29 in the case of the last address IAD(end) or proceeds to step S28 otherwise. In step S28, the content of the address IAD is incremented by the internal address generating circuit 22, and the program flow returns to the step S26 for a shift to the pre-erase write in the memory cell of the next address IAD. Subsequently, the pre-erase write will be executed while sequentially updating the address IAD, and the program flow proceeds to the step S29 when the pre-erase write of the last address IAD(end) is ended. That is, when I=0, the pre-erase write is executed from the address IAD=0 to the last address IAD(end)=16383, by which the pre-erase write is executed in all the memory cells connected to the word lines WL0 through WL255 in FIG. 4.

In step S29, the address IAD for executing write verify is set to the initial value "N" by the internal address generating circuit 22. In step S30, the write verify is executed by the verify circuit 25 in the memory cells of one byte in the region corresponding to the value of "I" according to the address IAD. It is to be noted that the write verify operation is as explained in connection with the prior art technology. It is determined in step S31 whether or not the result of the verify is acceptable by the internal sequence control section 21. Consequently, if it is determined that the threshold voltage of each memory cell is not lower than 5.0 V and acceptable, then it is determined that the pre-erase write is completed, and the program flow proceeds to step S33. If the threshold voltage is lower than 5.0 V, it is determined that the write is insufficient, and the program flow proceeds to step S32. In step S32, the rewrite is executed by the write circuit 24, and the program flow returns to the step S30 to execute again the write verify. Thus, the rewrite and the write verify are repeated until the threshold voltages of all the memory cells corresponding to the addresses become equal to or higher than 5.0 V. Then, the program flow proceeds to step S33 when the threshold voltages of all the memory cells become equal to or higher than 5.0 V.

It is determined in step S33 whether or not the address IAD is the last address IAD(end) by the internal sequence control section 21. Consequently, if the address IAD is the last address IAD(end), then the pre-erase write operation is ended, and the erase pulse starts to be applied. If the address IAD is not the last address IAD(end), then the program flow proceeds to step S34. In step S34, the content of the address IAD is incremented by the internal address generating circuit 22, and the program flow returns to the step S30 for a shift to the write verify of the memory cell of the next address IAD. Subsequently, the write verify is executed with the address IAD sequentially changed. When the write verify of the last address IAD(end) ends, the pre-erase write operation is ended, and the erase pulse starts to be applied.

Figure 14:
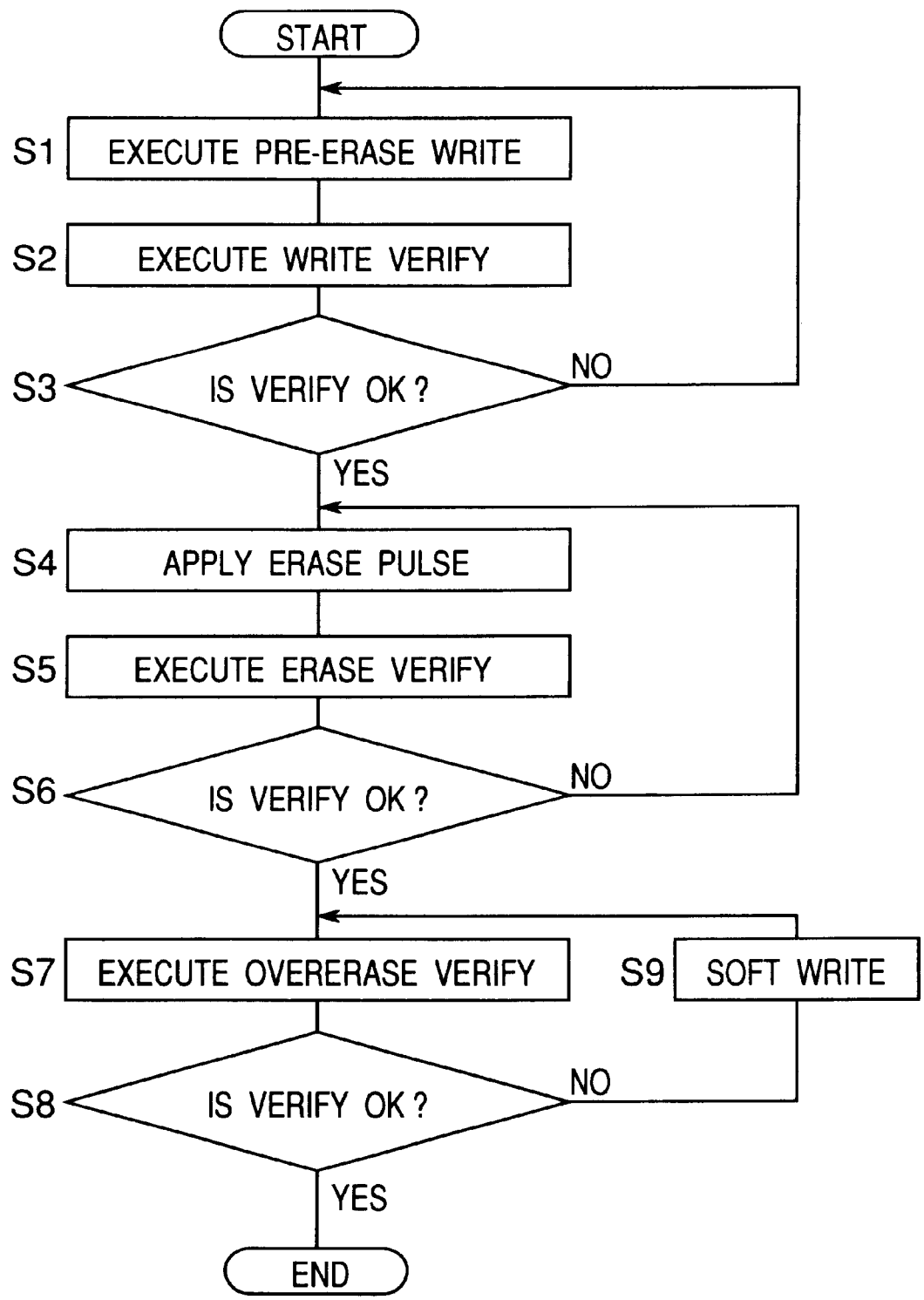
FIG. 14 is a flowchart of a conventional erase algorithm for preventing the occurrence of a memory cell in an overerased state.

By executing the operations from the step S21 to the step S34 as described above, when, for example, I=0, the pre-erase write operation and the write verify operation of the starting address IAD=0 to the last address IAD(end)=16383 in the region 0 are executed. Then, subsequently, a series of erase operations by the erase pulse application, the erase verify and the overerase verify of the entire one block of 64 kB is executed similarly to the operation subsequent to the step S4 of the erase algorithm shown in FIG. 14.

As described above, the pre-erase write operation of the present embodiment is similarly executed in the case of the region 1, the region 2 or the region 3, where the pre-erase write is executed only in each region. Therefore, when a series of erase operations including the pre-erase write of the present embodiment shown in FIG. 2 is started, the pre-erase write and the write verify are executed in only the memory cells in a certain region (the region 0, for example) in the block to be erased. Thereafter, the erase pulse application, the erase verify and the overerase verify are executed in all the memory cells of the block, and the erase operation is ended.

When the next erase operation is executed in the block, the pre-erase write is executed in the memory cell in the region (the region 1, for example) next to the region where the pre-erase write has been executed during the previous erase operation within the block according to the state of the erase frequency storage memory 29. Thereafter, the erase pulse application, the erase verify and the overerase verify are executed in all the memory cells of the block. Similar operations will be subsequently executed.

Therefore, paying attention to a certain region (the region 0, for example) in the present embodiment, the pre-erase write is to be executed once every time the aforementioned series of erase operations are executed four times in the block where the attentional region exists. The same thing can be said for the other regions.

That is, according to the present embodiment, one block in the memory cell array 27 is divided into four regions, and the pre-erase write is executed in only one region (¼ of one block) every erase operation. Therefore, it is possible to shorten the pre-erase write pulse applying time and the write verify time than in the case of the prior art nonvolatile semiconductor memory device in which the pre-erase write and the write verify are executed in the entire one block every erase operation.

For example, when the power voltage Vcc=1.8 V and the write can be concurrently executed in only one memory cell, the pre-erase write time of the memory cells of one block of 64 kB can be expressed by the equation (2):

$$2\ \mu s \times 64 \times 1024 \times 8 \div 4 = 262\ ms \qquad (2)$$

Further, with regard to a time required for the write verify executed after the pre-erase write, since the write verify time of all the memory cells of one block of 64 kB is about 90 ms, there holds the equation (3):

$$\text{about } 90 \div 4 = 23\ ms \qquad (3)$$

Further, the total erase pulse applying time during which the erase pulse is applied is about 300 ms equal to that of the case of the prior art nonvolatile semiconductor memory device because of one-block batch erase, and the total erase verify time is about 180 ms equal to that of the prior art. The overerase verify time is about 90 ms equal to that of the prior art since the overerase verify is executed collectively in one block.

Therefore, the total erase time is the sum of the pre-erase write time of 262 ms, the write verify time of about 23 ms, the total pulse applying time of about 300 ms, the total erase verify time of about 180 ms and the overerase verify time of about 90 ms, amounting to about 855 ms. Therefore, the total erase time is reduced by about 50% in comparison with the total erase time of 1708 ms when the power voltage Vcc=1.8 V in the aforementioned prior art nonvolatile semiconductor memory device. Moreover, the number of memory cells in which the pre-erase write is executed becomes one-fourth of that of the aforementioned prior art nonvolatile semiconductor memory device, and therefore, the consumption of current during the pre-erase write is also reduced.

Further, in the case of the present embodiment, the pre-erase write is not executed in three regions out of the four regions in one erase operation of the block to be erased. Accordingly, there is also mixed a memory cell in an erased state of a low threshold voltage in the block immediately before the erase pulse application. In general, as the potential difference between the floating gate and the source region of a memory cell becomes larger during the erase pulse application, i.e., as the threshold voltage of the memory cell becomes higher due to a large amount of electrons injected into the floating gate, more depletion is generated in the region below the floating gate by this potential difference. Therefore, an increased quantity of leak current from the source region to the substrate (well) of the memory cell tends to be easily generated by a BTBT current (Band to Band Tunneling current), as a consequence of which the consumption of current increases. Therefore, the mixture of the memory cell in the erased state of a low threshold voltage during the erase pulse application leads to a reduction in the consumption of current with a reduced BTBT current.

On the other hand, when a memory cell of a low threshold voltage exists during the erase pulse application, the threshold voltage of the memory cell of the low threshold voltage is further lowered by the erase pulse application, easily causing the overerased state. Therefore, in the present embodiment, it is possible that the overerase occurs more than in the prior art nonvolatile semiconductor memory device. This point will be inspected below.

Figure 15:
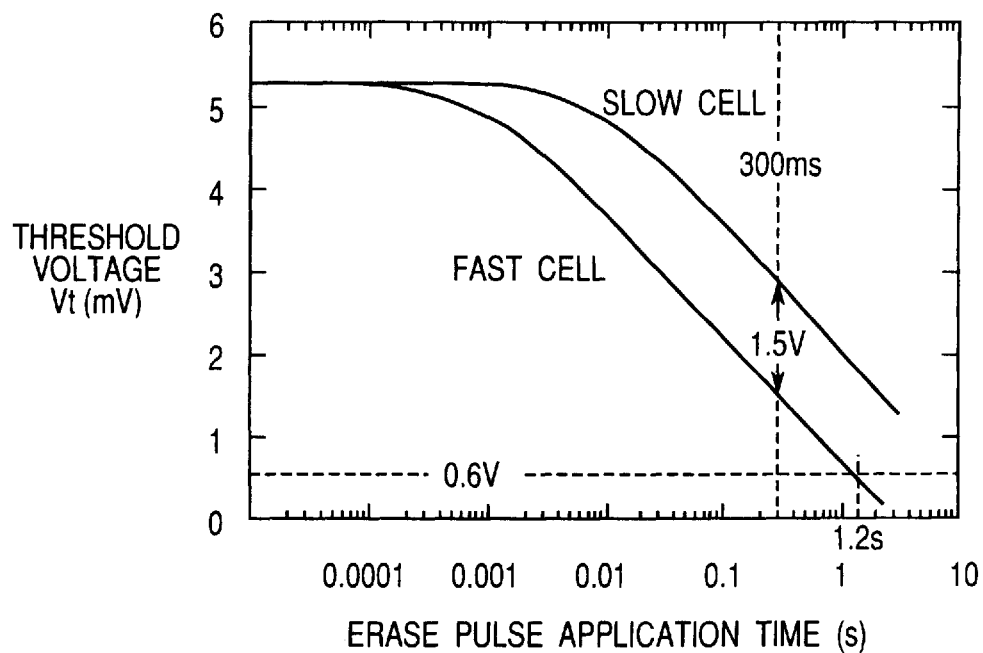
FIG. 15 is a graph showing an example of a change in threshold voltage with respect to the erase pulse applying time of the memory cell.
Figure 16:
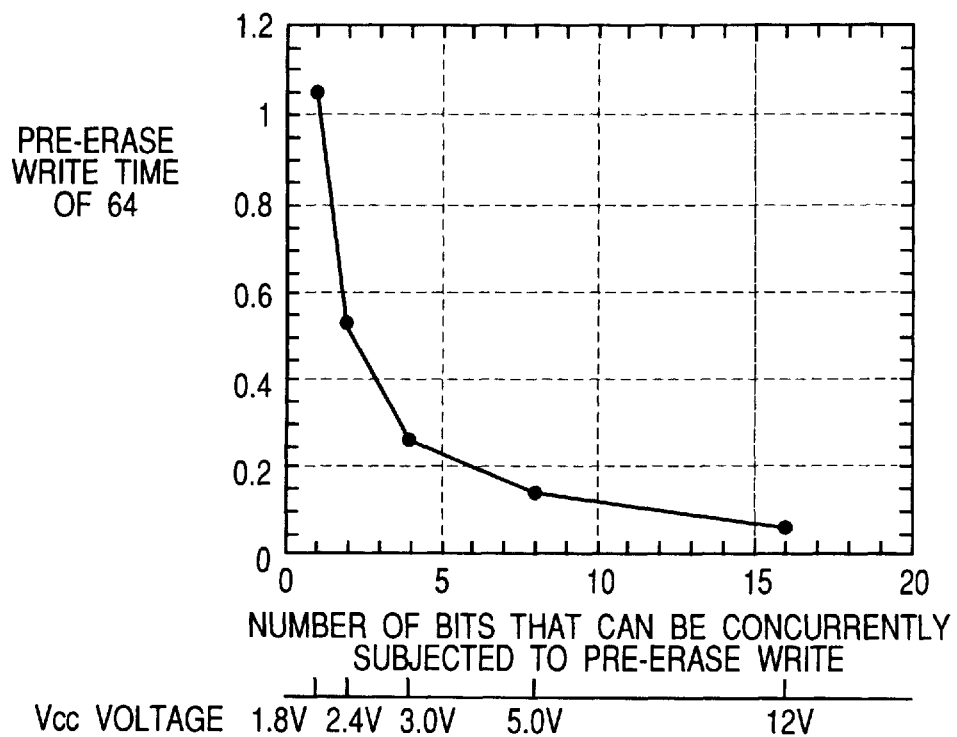
FIG. 16 is a graph showing a relation between a power voltage Vcc and a pre-erase write time.

FIG. 15 shows one example of the erase characteristics of the flash memory cells employed in the present embodiment, in which a slow cell of the slowest erase speed and a fast cell of the fastest erase speed are shown. The slow cell is the memory cell in which the reduction in the threshold voltage in compliance with the erase pulse application is the slowest, and the erase pulse continues being applied during the erase pulse application until the threshold voltage of this memory cell becomes equal to or lower than 3 V.

On the other hand, the fast cell is the memory cell in which the reduction in the threshold voltage in compliance with the erase pulse application is the fastest. During the erase pulse application, it is required to take some measures such as the execution of the pre-erase write every several erase operations so that the threshold voltage of this memory cell is not put into the overerased state and the dividing of the memory cell array 27 into several regions for the above reasons.

As shown in FIG. 15, with regard to the threshold voltage distribution due to the variations in the erase characteristics of the memory cells, the total erase pulse applying time becomes 300 ms, and, when the threshold voltage of the slow cell reaches 3.0 V, the threshold voltage of the fast cell is reduced to a value that is about 1.5 V lower than the voltage value. Therefore, the threshold voltage of the fast cell becomes about 1.5 V, and the threshold voltage distribution due to the variations in the erase characteristics falls within a range of 1.5 V to 3.0 V.

As described above, in the present embodiment, the pre-erase write is executed only once every four erase operations in one region of one block of the memory cell array 27. Therefore, the memory cells in one region include those to which only the erase pulse is applied for a maximum of 1.2 sec (=300 ms×4) if there is no write (program) with information data. In this case, as is apparent from FIG. 15, the threshold voltage of the fast cell is lowered to 0.6 V but not lowered to 0 V or less. Therefore, the soft write is not executed since the overerased state is not established even if the overerase verify is subsequently executed.

It is to be noted that the threshold voltage is required to be raised by the soft write if the memory cell in the overerased state occurs. However, according to the above description, it is estimated that the ratio of the occurrence of the memory cells in the overerased state in a series of erase operations of the present embodiment is not increased in comparison with the prior art nonvolatile semiconductor memory device. Therefore, the reduction in the pre-erase write time directly leads to a reduction in the total time of a series of erase operations.

As described above, with regard to the distribution of the threshold voltage during the erase of the memory cells employed in the memory cell array 27 of the present embodiment, the fast cell is not put in the overerased state even if the erase pulse application of a duration of 300 ms is executed four times, as shown in FIG. 15. Accordingly, taking advantage of the above fact, by dividing one block of the memory cell array 27 into four regions and providing the erase frequency storage memory 29 that has the memory cells (M1, M2, M3) for storing the 3-bit erase frequency, the pre-erase written state of each region is written. Then, by referring to the contents of the erase frequency storage memory 29, the pre-erase write and the write verify are sequentially executed in one region every four erase operations for one block.

Thus, by setting the region of the pre-erase write and the write verify executed during one erase operation to one-fourth of that of the prior art nonvolatile semiconductor memory device, the pre-erase write pulse applying time and the write verify time can each be reduced to one-fourth of that of the prior art nonvolatile semiconductor memory device, consequently enabling the total erase time to be shortened. Therefore, the total erase time when the write can be concurrently executed in only one memory cell due to the arrangement that the power voltage Vcc=1.8 V can be reduced by about 50% to about 855 ms in comparison with 1708 ms in the prior art nonvolatile semiconductor memory device.

That is, according to the present embodiment, the increase in the pre-erase write time ascribed to the reduction in the operating voltage can be reduced. Furthermore, since the number of memory cells in which the pre-erase write is executed is reduced to one-fourth of that of the prior art nonvolatile semiconductor memory device, the consumption of current during the pre-erase write can also be reduced.

As described above, even if there is a memory cell to which only the erase pulse is applied for 1.2 sec (=300 ms×4) at maximum among the memory cells in one region of the memory cell array 27 in the above case, the fast cell is not put in the overerased state.

(Second Embodiment)

In connection with the first embodiment, there has been described the case of block erase such that the memory cell array 27 is collectively erased in blocks. In connection with the present second embodiment, the case of full-chip erase such that the whole memory cell array is subjected to batch erase will be described.

Figure 6:
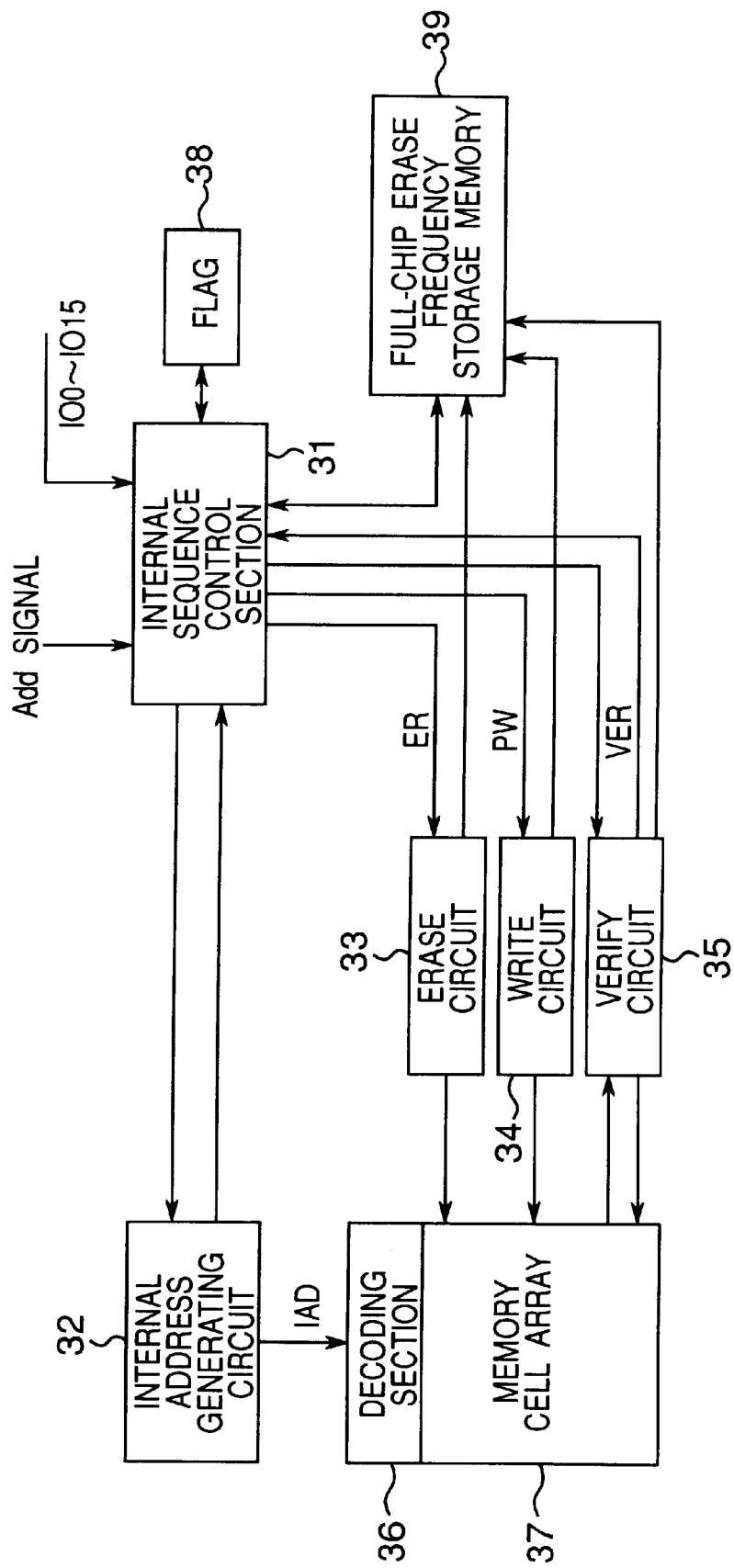
FIG. 6 is a block diagram of an erase control circuit different from that of FIG. 1.

FIG. 6 is a block diagram of an erase control circuit for controlling the erase operation in the nonvolatile semiconductor memory device of the present second embodiment. As is apparent from FIG. 6, the present erase control circuit has the same basic construction as the erase control circuit shown in FIG. 1 and is constituted of an internal sequence control section 31, an internal address generating circuit 32, an erase circuit 33, a write circuit 34, a verify circuit 35, a decoding section 36, a memory cell array 37, a flag 38 and a full-chip erase frequency storage memory 39.

The erase control circuit shown in FIG. 6 has roughly the same construction as the conventional erase control circuit shown in FIG. 17 except for the flag 38 and the full-chip erase frequency storage memory 39. The full-chip erase frequency storage memory 39 is constructed of the same flash memory (ETOX type flash memory in this case) as the main memory cell array 37 and stores the erase frequency of full-chip erase. In the present second embodiment, one example in which the number of memory cells in the full-chip erase frequency storage memory 39 is three will be described. The flag 38 is a latch circuit, which latches "1" when all the memory cells for full-chip erase frequency storage use in the full-chip erase frequency storage memory 39 are in the written state.

Figure 7:
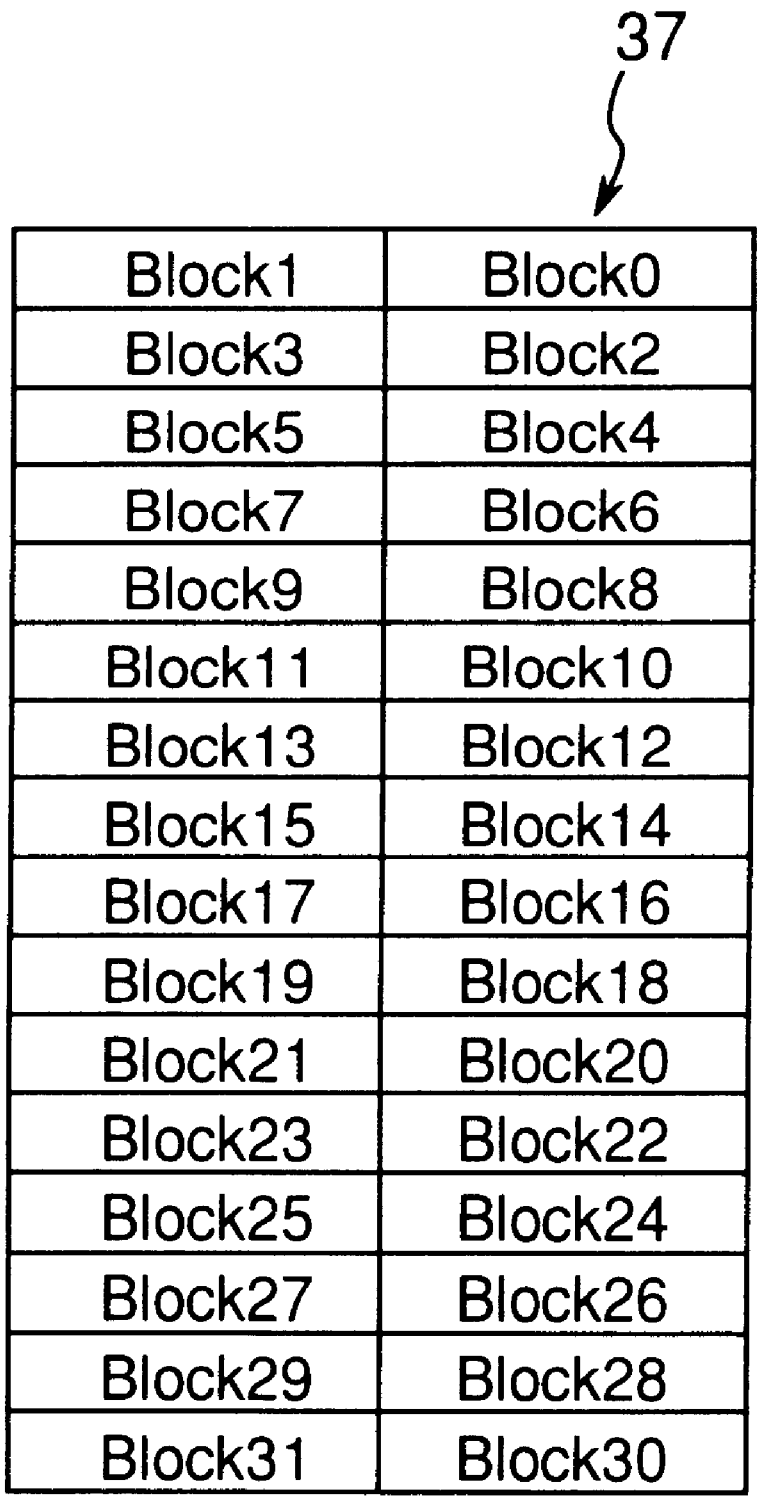
FIG. 7 is a view showing a structural example of an erase block in a memory cell array of 16 M.

FIG. 7 shows one example of the construction of the erase block of the memory cell array 37 of 16 M. As is apparent from FIG. 7, there exist 32 blocks of 64 kB (512 kilobits) in the erase block. With regard to the full-chip erase of the ETOX type flash memory, the erase operation is executed one block by one block for 32 blocks in relation to the capability of the internal boosting use charge pump used during erase.

Figure 11:
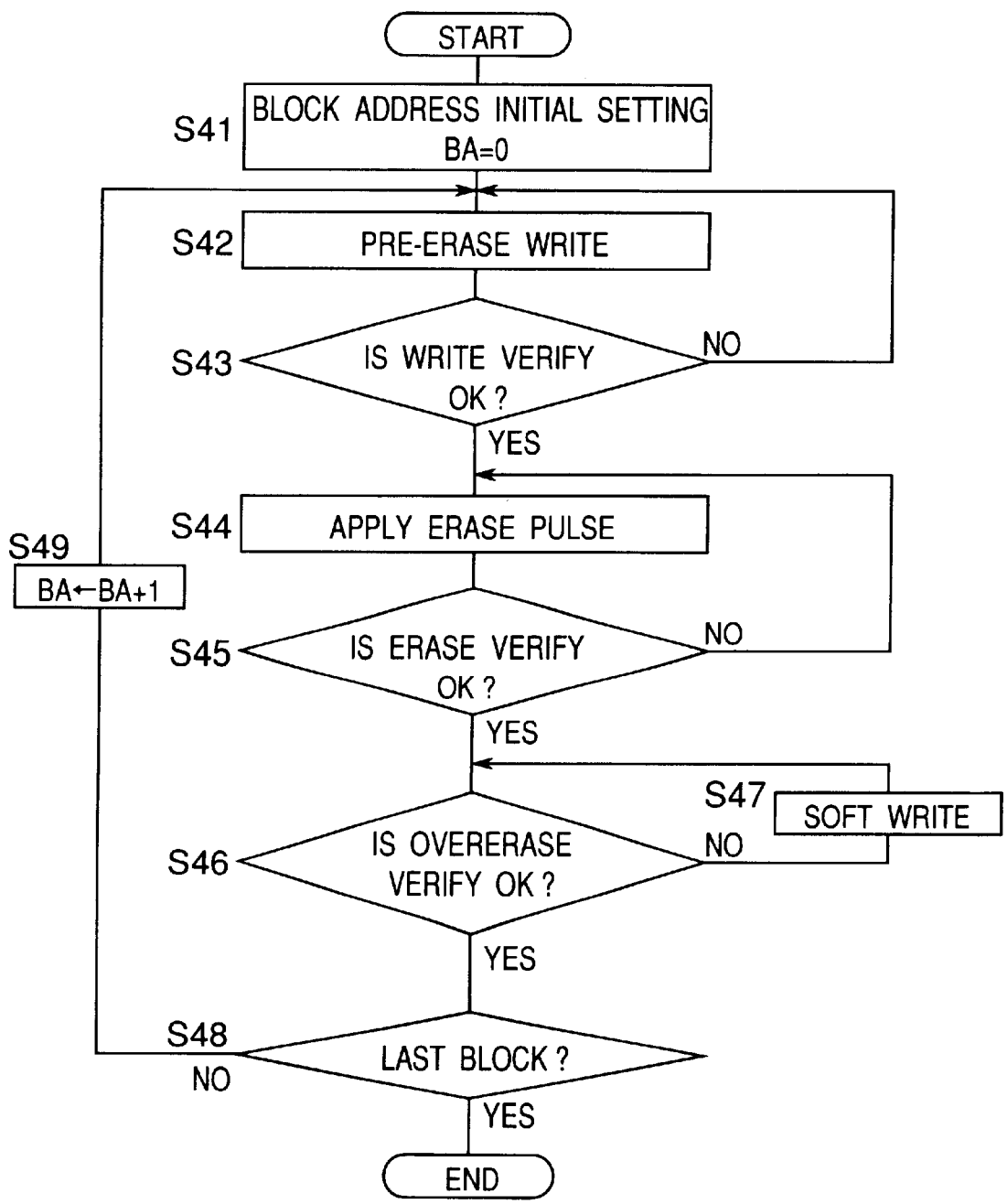
FIG. 11 is a flowchart of a conventional full-chip erase processing operation.

FIG. 11 shows a flowchart of the full-chip erase processing operation of the prior art nonvolatile semiconductor memory device. In FIG. 11, when a command of the full-chip erase is inputted, the processing is executed first from a block 0 in the order of pre-erase write, write verify, erase pulse application, erase verify and overerase verify, and the soft write is executed as the need arises. Then, a block 1 is processed continuously from the end of the above-mentioned processing operation of the block 0, and the other blocks will be subsequently sequentially processed. Then, a block 31 is finally processed to end the full-chip erase. Therefore, when the power voltage Vcc is 1.8 V, the full-chip erase time is 54.7 seconds (=1208 ms×32 blocks).

FIGS. 8A through 8D show the concept of the full-chip erase algorithm of the present second embodiment. In the present second embodiment, when executing the full-chip erase, the pre-erase write is executed in the blocks of the multiples of 4 such as block 0, block 4, . . . , block 28 as shown in FIG. 8A during a first-time full-chip erase operation. Further, during a second-time full-chip erase operation, the pre-erase write is executed in the blocks of the (multiples of 4+1) such as block 1, block 5, block 29 as shown in FIG. 8B. Likewise, during third-time and fourth-time full-chip erase operations, the pre-erase write is executed in the blocks of the (multiples of 4+2) and (multiples of 4+3) as shown in FIGS. 8C and 8D. Further, during a fifth-time full-chip erase operation, the pre-erase write is executed in the blocks of the multiples of 4 similarly to the first time.

Figure 9:
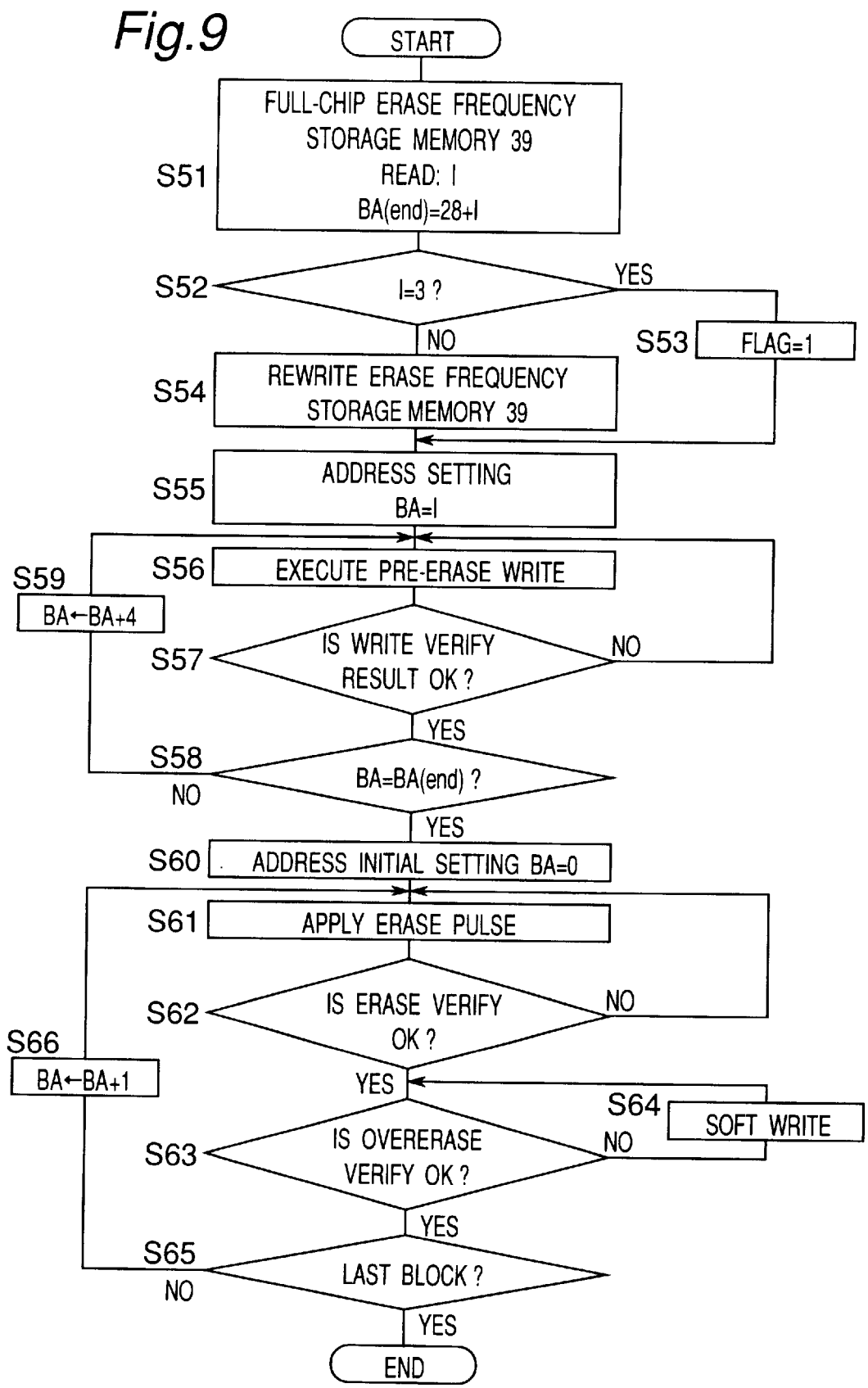
FIG. 9 is a flowchart of the algorithm of full-chip erase executed by the erase control circuit shown in FIG. 6.

FIG. 9 is a flowchart of the full-chip erase algorithm executed by the erase control circuit shown in FIG. 6. The full-chip erase operation of all the blocks of the memory cell array 37 will be described below with reference to FIGS. 6 and 9. When the full-chip erase operation is started, the state (the state of the 3-bit memory cells M1, M2 and M3) of the full-chip erase frequency storage memory 39 is first read in step S51 by the internal sequence control section 31, and the result is assumed to be I. The last address BA(end) of the pre-erase write and the write verify is obtained by the following equation:

$$BA(end)=28+I$$

It is to be noted that the memory cell structure of the full-chip erase frequency storage memory 39, the relation of "I" to the state of each memory cell, the write method of each memory cell, the setting of the flag 38 and so on are not different from those of the first embodiment, and therefore, no description is provided for them.

It is determined in step S52 whether or not I=3 by the internal sequence control section 31. Then, the program flow proceeds to step S53 if I=3, otherwise proceeds to step S54. In step S53, the flag 38 is set to "1" by the internal sequence control section 31. Thereafter, the program flow proceeds to step S55. In step S54, the state of the memory cells (M3, M2, M1) of the full-chip erase frequency storage memory 39 is rewritten into the state of the next I by the internal sequence control section 31. That is, when, for example, currently, I=0, write is executed in the memory cell M1, and the state of the erase frequency storage memory 29 is rewritten into (1, 1, 0).

In step S55, the address BA for executing the pre-erase write is set to the initial value "I" by the internal address generating circuit 32. In step S56, the pre-erase write is executed in the memory cell inside the block corresponding to the value of "I" according to the address BA by the write circuit 3. In step S57, the write verify is executed in the memory cell of the block in which the pre-erase write has been executed by the verify circuit 35, and it is determined whether or not the result of the verify is acceptable by the internal sequence control section 31. Consequently, the program flow proceeds to step S58 if the threshold voltage of each memory cell is not lower than 5.0 V and determined to be acceptable. If the threshold voltage is lower than 5.0 V, it is determined that the write is insufficient, and the program flow returns to the step S56 to execute again the pre-erase write. It is determined in step S58 whether or not the address BA is the last address BA(end) by the internal sequence control section 31. Consequently, the program flow proceeds to step S60 in the case of the last address BA(end), otherwise proceeds to step S59. In step S59, four is added to the content of the address BA by the internal address generating circuit 32. Thereafter, the program flow returns to the step S56 for a shift to the pre-erase write and the write verify of the block of the next address. Subsequently, the pre-erase write and the write verify are executed with the address BA sequentially changed, and the program flow proceeds to the step S60 when the pre-erase write and the write verify of the last address BA(end) are ended.

In step S60, the address BA is set to the initial value "0" by the internal address generating circuit 32. In step S61, the erase pulse application to the memory cell of the block that corresponds to the address BA is executed by the erase circuit 33. It is to be noted that the operation of the erase pulse application is as explained in connection with the prior art technology. In step S62, the erase verify is executed in the memory cell of the block by the verify circuit 35, and it is determined whether or not the result is acceptable by the internal sequence control section 31. Consequently, the program flow proceeds to step S63 if the threshold voltages of all the memory cells are not higher than 3.0 V and determined to be acceptable, or otherwise returns to the step S61 to execute again the erase pulse application and the erase verify. Then, the program flow proceeds to the step S63 when the threshold voltages of all the memory cells that correspond to the address become equal to or lower than 3.0 V.

In step S63, the overerase verify is executed by the verify circuit 35, and it is determined whether or not the result is acceptable by the internal sequence control section 31. Consequently, the program flow proceeds to step S65 if the threshold voltages of all the memory cells of the block are not lower than 0 V and determined to be acceptable. Otherwise, the program flow proceeds to step S64. In step S64, the soft write is executed by the write circuit 34. Thereafter, the program flow returns to the step S63 to execute again the overerase verify. Thus, the program flow proceeds to the step S65 when the threshold voltages of all the memory cells that correspond to the address become equal to or higher than 0 V.

It is determined in step S65 whether or not the address BA is the address "31" of the last block by the internal sequence control section 31. Consequently, if the block is the last block 31, then the full-chip erase processing operation is ended. If the block is not the last block 31, then the program flow proceeds to step S66. In step S66, the content of the address BA is incremented by the internal address generating circuit 32. Thereafter, the program flow returns to the step S61 for a shift to the erase pulse application, the erase verify and the overerase verify of the memory cells of the block that corresponds to the next address. Subsequently, the erase pulse application, the erase verify and the overerase verify are executed with the address BA sequentially changed, and the full-chip erase processing operation is ended when the erase pulse application, the erase verify and the overerase verify of the memory cells of the last block "31" are ended.

When the flag 38 is set to "1" in the step S53 since I is "3", the erase pulse is also concurrently applied to the 3-bit memory cell inside the full-chip erase frequency storage memory 39 so as to execute erase by lowering the threshold voltage when applying the erase pulse to the memory cell of the block 0 in the step S61.

When the power voltage Vcc is 1.8 V and the pre-erase write is executed one by one (one bit by one bit) to the memory cell at the same time, a time required for the full-chip erase of the 16-Mbit memory cell array 37 constructed of 32 blocks respectively having 64 kB in the present second embodiment is as follows.

(1) The time required for the pre-erase write of eight blocks is:

$$2 \, \mu s \times 64 \times 1024 \times 8 \times 8 = 8.4 \, sec$$

(2) The time required for the write verify of eight blocks is:

$$about \, 90 \, ms \times 8 = 0.72 \, sec$$

(3) The total erase pulse applying time required for erase pulse application to 32 blocks is:

$$about \, 300 \, ms \times 32 = 9.6 \, sec$$

(4) The time required for the erase verify of 32 blocks is:

$$about \, 180 \, ms \times 32 = 5.76 \, sec$$

(5) The time required for the overerase verify of 32 blocks is:

$$about \, 90 \, ms \times 32 = 2.88 \, sec$$

Therefore, the time required for a series of full-chip is erase operation is 27.4 sec, or the sum of the times of (1) through (5). Accordingly, the erase time can be remarkably reduced by about 50% in comparison with the time of 54.7 sec required by the conventional full-chip erase method.

As described above, in the present second embodiment, the memory cell array 37 is divided into 32 blocks, and the pre-erase write is executed in eight blocks in one full-chip erase operation. Therefore, in one block, the pre-erase write is executed only once in four full-chip erase operations. Therefore, the memory cells in one region include those to which only the erase pulse is applied for a maximum of 1.2 sec (=300 ms×4) if there is no write with information data. In this case, as is apparent from FIG. 15, the threshold voltage of the fast cell is lowered to 0.6 V but not lowered to 0 V or less. Therefore, the overerased state does not occur.

It is estimated that the ratio of occurrence of the memory cell in the overerased state during a series of full-chip erase operation in the present embodiment does not become increased in comparison with the prior art nonvolatile semiconductor memory device. Therefore, the reduction in the pre-erase write time leads directly to the reduction in the total time of a series of full-chip erase operation. Moreover, by the reduction in the number of memory cells in which the pre-erase write is executed in one full-chip erase operation to one-fourth of that of the prior art nonvolatile semiconductor memory device, the consumption of current during the pre-erase write is reduced. Furthermore, the number of memory cells in which the pre-erase write is executed is made less than in the prior art nonvolatile semiconductor memory device. Therefore, a memory cell in the erased state of a low threshold voltage is also mixed in the memory cell array 37 immediately before the erase pulse application. Therefore, the BTBT current is reduced to reduce the consumption of current.

Figure 10:
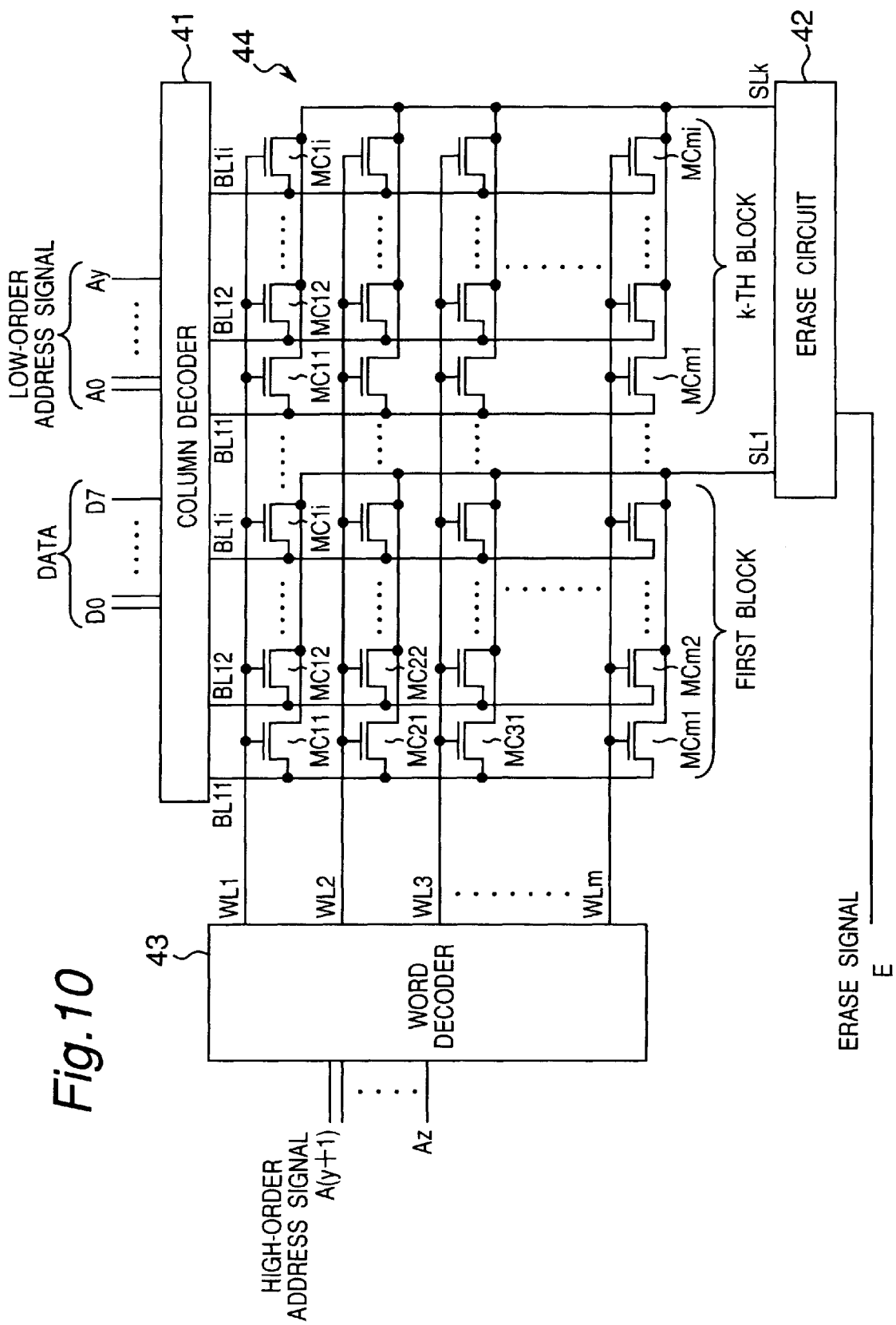
FIG. 10 is a diagram showing the construction of a memory cell array and its peripherals.

The constructions of the memory cell arrays 27 and 37 and their peripherals will be simply described with reference to the schematic view shown in FIG. 10. FIG. 10 shows one example of the construction of a source common type memory cell array divided into a plurality of blocks.

The construction shown in FIG. 10 is an example of memory cells divided on the column side, where memory cells MC connected to one word line WL are grouped every i (i: positive integer) cells and divided into k (k: positive integer) blocks. The drain of the memory cell MC×1 (x=1 to m (m: positive integer)) of the first column in the first block is commonly connected to a bit line BL11 and connected to a column decoder 41 via the bit line BL11. Likewise, the drain of the memory cell MC×2 is commonly connected to the bit line BL12 and connected to the column decoder 41. Similar connections are provided for the other memory cells, and the drain of the memory cell MC×i is commonly connected to a bit line BL1i and connected to the column decoder 41. In this case, the drains of the memory cells MC that belong to the second through k-th blocks are similarly connected.

Moreover, the sources of all the memory cells MC in each block are commonly connected to a common source line SL and connected to an erase circuit 42. Then, the erase circuit 42 is selected by an erase signal E to supply during erase a specified erase voltage to the common source line SL of the block to be erased, applying the erase voltage to the sources of all the memory cells MC inside the block.

High-order address signals A(y+1) through Az (z=16, for example) are inputted to a word decoder 43. Then, by decoding the address signal by this word decoder 43, the desired one word line WL is selected. On the other hand, data (D0 through D7, for example, in the case of eight bits) and low-order address signals A0 through Ay (y=5, for example) are inputted to the column decoder 41. Then, the desired bit line BL is selected by decoding the address signal by this column decoder 41. The data D0 through D7 are outputted to the selected bit line BL during write. During read, data are read by applying a voltage of 1 V to the selected bit line BL and detecting the potential of the bit line BL by a sense circuit (not shown). In the erase operation, the bit line BL is put into an open state by making the output of the column decoder 41 have high impedance. It is to be noted that the sense circuit is included in the column decoder 41.

A memory cell array 44 has the word lines WL1, WL2, . . . , WLm (m=1024, for example), and the control gates of n (n=512, for example) memory cells MC are connected to each word line WL. These memory cells MCmn are divided into k (k=32, for example) blocks as described above. Therefore, assuming that, for example, m=1024, n=512 and k=32, then the number i of the bit lines BL of one block is i=16.

In this case, the memory cell array 44 corresponds to the memory cell arrays 27 and 37 in each of the aforementioned embodiments, the column decoder 41 and the word decoder 43 correspond to the decoding sections 26 and 36 in each of the aforementioned embodiments, and the erase circuit 42 corresponds to the erase circuits 23 and 33 in each of the aforementioned embodiments.

Although FIG. 10 shows an example in which the memory cells are grouped in blocks every bit line BL (divided on the column side), the memory cells may be grouped in blocks every word line WL (divided on the row side). It is also acceptable to combine the block forming done every bit line BL with the block forming done every word line WL.

As is apparent from the above, the nonvolatile semiconductor memory device of this invention divides the floating-gate field-effect transistors that belong to the erase object division to be subjected to batch erase into n (positive integer) regions, stores the erase frequency into the erase frequency storage means corresponding to the erase object division when the erase is executed in the erase object division, sets the address of the region in which the pre-erase write is executed by an address setting means on the basis of the storage contents of the erase frequency storage means, stores the flag information into the flag means when the erase frequency corresponding to the erase object division reaches n and resets the storage contents of the erase frequency storage means by an erase frequency resetting means. Therefore, the pre-erase write is executed in only the floating-gate field-effect transistors of 1/n of the erase object division to be subjected to erase every one erase operation corresponding to the erase object division.

Therefore, the pre-erase write time in one erase operation becomes 1/n of that of the prior art, and the total erase operation time can be consequently reduced. That is, according to this invention, the increase in erase time ascribed to the reduction in the operating voltage can be prevented.

In the above case, the threshold voltage of the floating-gate field-effect transistor does not become negative by the erase pulse applied for several seconds even in the case of the fast-erase floating-gate field-effect transistor. Therefore, by setting the division number n of the erase object division according to the erase pulse applying time until the threshold voltage of the fast-erase floating-gate field-effect transistor becomes negative, it is enabled to prevent the possible occurrence of the floating-gate field-effect transistor in the overerased state even if the number of floating-gate field-effect transistors in which the pre-erase write is executed is reduced.

Furthermore, by virtue of the reduction in the number of floating-gate field-effect transistors in which the pre-erase write is concurrently executed, the consumption of current during the pre-erase write can be reduced. Furthermore, by virtue of the reduction in the number of floating-gate field-effect transistors in which the pre-erase write is concurrently executed, there is a reduced number of floating-gate field-effect transistors of a high threshold voltage when the erase pulse is applied subsequently to the pre-erase write. Therefore, the BTBT current generated during the erase pulse application is reduced, and the consumption of current during the erase operation can be consequently reduced.

Furthermore, the erase method of the nonvolatile semiconductor memory device of this invention executes the pre-erase write in only the floating-gate field-effect transistors of 1/n of the floating-gate field-effect transistors that belong to the erase object division to be subjected to batch erase. Therefore, the pre-erase write time in one erase operation becomes 1/n of that of the prior art, and the total erase operation time can be consequently reduced. That is, according to this invention, the increase in the erase time ascribed to the reduction in the operating voltage can be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor memory device in which floating-gate field-effect transistors that respectively have a control gate, a floating-gate, a drain and a source and are able to electrically write and erase information are arranged in a matrix form on a substrate or a well with a plurality of row lines connected to the control gates of the floating-gate field-effect transistors arranged in a direction of row and with a plurality of column lines connected to the drains of the floating-gate field-effect transistors arranged in a direction of column and in which the floating-gate field-effect transistors that constitute a block have their sources connected to a common source line, wherein the floating-gate field-effect transistors, which belong to an erase object division to be subjected to batch erase, are divided into n (positive integer) regions, and comprising: for each erase object division,
an erase frequency storage means for storing an erase frequency of the erase object division;
an address setting means for setting addresses of regions which belongs to the erase object division and in which pre-erase write is executed on the basis of storage contents of the erase frequency storage means;
a flag means for storing flag information that represents the erase frequency reaching n every time the erase frequency of the erase object division reaches n; and
an erase frequency resetting means for resetting the storage contents of the erase frequency storage means when the flag information is stored in the flag means.

2. A nonvolatile semiconductor memory device as claimed in claim 1, wherein
the erase object division is the block.

3. A nonvolatile semiconductor memory device as claimed in claim 1, wherein
the erase object division is a memory cell array comprised of the floating-gate field-effect transistors arranged in a matrix form, and
the division into n regions of the erase object division is executed in the blocks.

4. A nonvolatile semiconductor memory device as claimed in claim 1, wherein
the erase frequency storage means is comprised of (n−1) nonvolatile semiconductor memories.

5. A nonvolatile semiconductor memory device as claimed in claim 4, wherein
the nonvolatile semiconductor memories that constitute the erase frequency storage means have a structure identical to that of the floating-gate field-effect transistors arranged in a matrix form.

6. A nonvolatile semiconductor memory device as claimed in claim 4, comprising:
an erase control means for operating, when an erase operation of an arbitrary erase object division is started, to read the (n−1) nonvolatile semiconductor memories that constitute the erase frequency storage means corresponding to the erase object division and operating, when any unwritten nonvolatile semiconductor memory or memories exist, to execute write in one of the nonvolatile semiconductor memories and operating, when all the nonvolatile semiconductor memories are in a written state, to store the flag information into the flag means.

7. A nonvolatile semiconductor memory device as claimed in claim 1, wherein the flag means is comprised of a latch circuit.

8. An erase method for a nonvolatile semiconductor memory device in which floating-gate field-effect transistors that respectively have a control gate, a floating-gate, a drain and a source and are able to electrically write and erase information are arranged in a matrix form on a substrate or a well with a plurality of row lines connected to the control gates of the floating-gate field-effect transistors arranged in a direction of row and with a plurality of column lines connected to the drains of the floating-gate field-effect transistors arranged in a direction of column and in which the floating-gate field-effect transistors that constitute a block have their sources connected to a common source line, the erase method comprising the step of:

executing pre-erase write in only floating-gate field-effect transistors of $1/n$ ($n \geq 2$) of the floating-gate field-effect transistors that belong to an erase object division to be subjected to batch erase.

9. An erase method for a nonvolatile semiconductor memory device as claimed in claim 8, wherein the erase object division is the block.

10. An erase method for a nonvolatile semiconductor memory device as claimed in claim 8, wherein the erase object division is a memory cell array comprised of the floating-gate field-effect transistors arranged in a matrix form, and the floating-gate field-effect transistors in which the pre-erase write is executed are set in the blocks.

11. An erase method for a nonvolatile semiconductor memory device as claimed in claim 8, wherein the $1/n$ floating-gate field-effect transistors are set by dividing the erase object division into n regions, and the pre-erase write is executed in only one region out of the n regions that constitute the erase object division during one erase operation for the erase object division.

12. An erase method for a nonvolatile semiconductor memory device as claimed in claim 11, wherein the n regions that constitute the erase object division are assumed to be a region 0 through a region $(n-1)$, the pre-erase write is executed in only the region 0 during a $(n \cdot k$ (k: 0 or positive integer)$+1)$ th erase operation, the pre-erase write is executed in only the region 1 during a $(n \cdot k+2)$th erase operation, and the pre-erase write is executed sequentially to a region $(n-1)$ until a $(n \cdot k+n)$th erase operation.

13. An erase method for a nonvolatile semiconductor memory device as claimed in claim 11, wherein the pre-erase write is executed in only one region selected from regions of a least pre-erase write frequency out of the n regions that constitute the erase object division.

* * * * *